United States Patent
Breinlinger

(10) Patent No.: US 7,825,675 B2
(45) Date of Patent: Nov. 2, 2010

(54) METHOD AND APPARATUS FOR PROVIDING ACTIVE COMPLIANCE IN A PROBE CARD ASSEMBLY

(75) Inventor: Keith J. Breinlinger, San Ramon, CA (US)

(73) Assignee: FormFactor, Inc., Livermore, CA (US)

( * ) Notice: Subject to any disclaimer, the term of this patent is extended or adjusted under 35 U.S.C. 154(b) by 434 days.

(21) Appl. No.: 11/555,567

(22) Filed: Nov. 1, 2006

(65) Prior Publication Data

US 2008/0100312 A1    May 1, 2008

(51) Int. Cl.
*G01R 31/02*  (2006.01)
(52) U.S. Cl. ...................................... 324/754
(58) Field of Classification Search ................. 324/754, 324/761–762, 765, 158.1; 257/48; 438/14–18
See application file for complete search history.

(56) References Cited

U.S. PATENT DOCUMENTS

| 6,246,247 | B1 | 6/2001 | Eldridge et al. |
| 6,384,734 | B1 * | 5/2002 | Ohno et al. ................. 340/679 |
| 6,509,751 | B1 | 1/2003 | Mathieu et al. |
| 6,624,648 | B2 | 9/2003 | Eldridge et al. |
| 6,784,678 | B2 | 8/2004 | Pietzschmann |
| 6,841,991 | B2 * | 1/2005 | Martin et al. ............ 324/158.1 |
| 2002/0067181 | A1 | 6/2002 | Eldridge et al. |
| 2004/0113640 | A1 | 6/2004 | Cooper |
| 2004/0266089 | A1 | 12/2004 | Mathieu et al. |
| 2006/0043985 | A1 | 3/2006 | Eldridge |

OTHER PUBLICATIONS

U.S. Appl. No. 09/527,931, filed Mar. 17, 2007, Mathieu et al.
PCT Search Report PCT/US 07/83264 (Sep. 5, 2008).
U.S. Appl. No. 11/423,878, filed Jun. 13, 2006, John Gritters.
International Preliminary Report On Patentability PCT/US 07/083264 (May 14, 2009).

* cited by examiner

*Primary Examiner*—Ha Tran T Nguyen
*Assistant Examiner*—Tung X Nguyen
(74) *Attorney, Agent, or Firm*—Kirton & McConkie

(57) ABSTRACT

A probe card assembly can comprise a first source of compliance and a second source of compliance. The probe card assembly can further comprise a controller, which can be configured to apportion a total compliance demand placed on the probe card assembly between the first source of compliance and the second source of compliance.

30 Claims, 17 Drawing Sheets

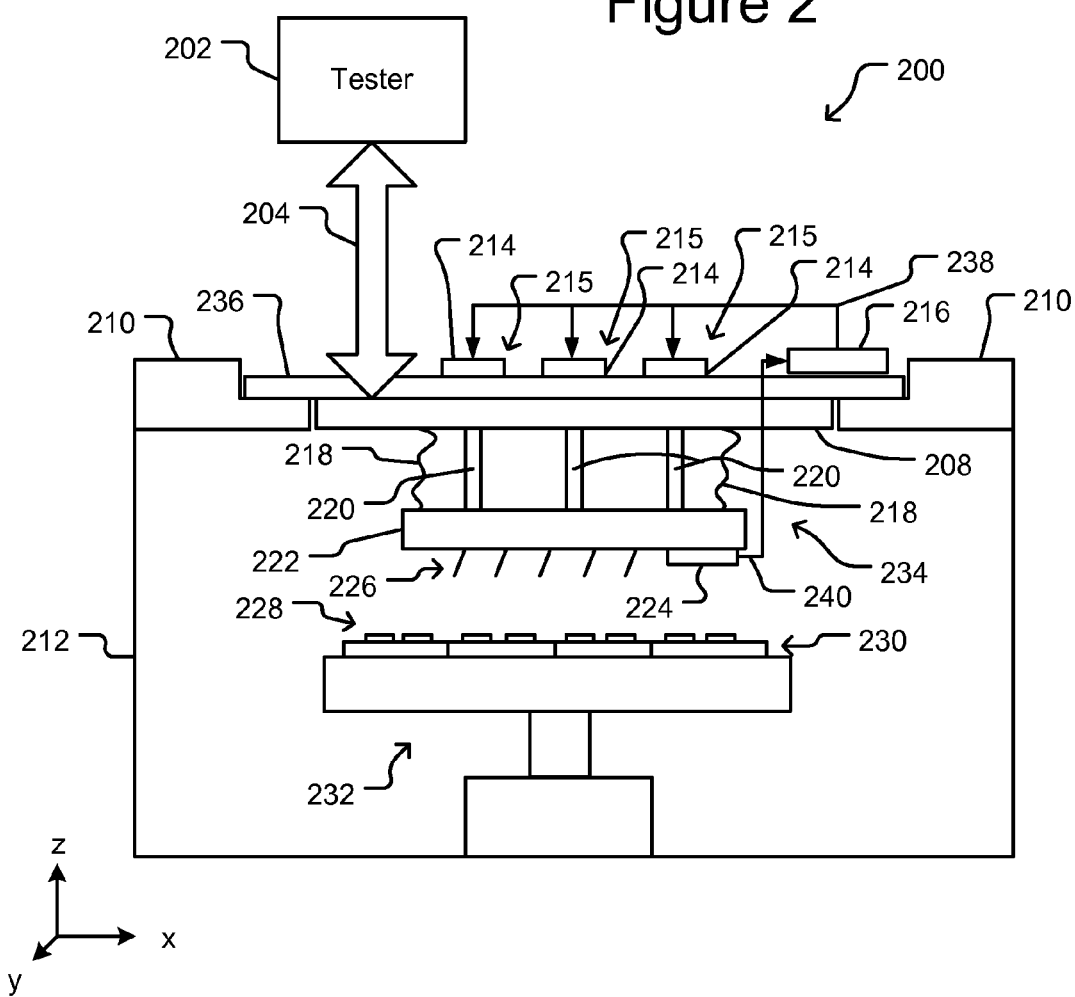

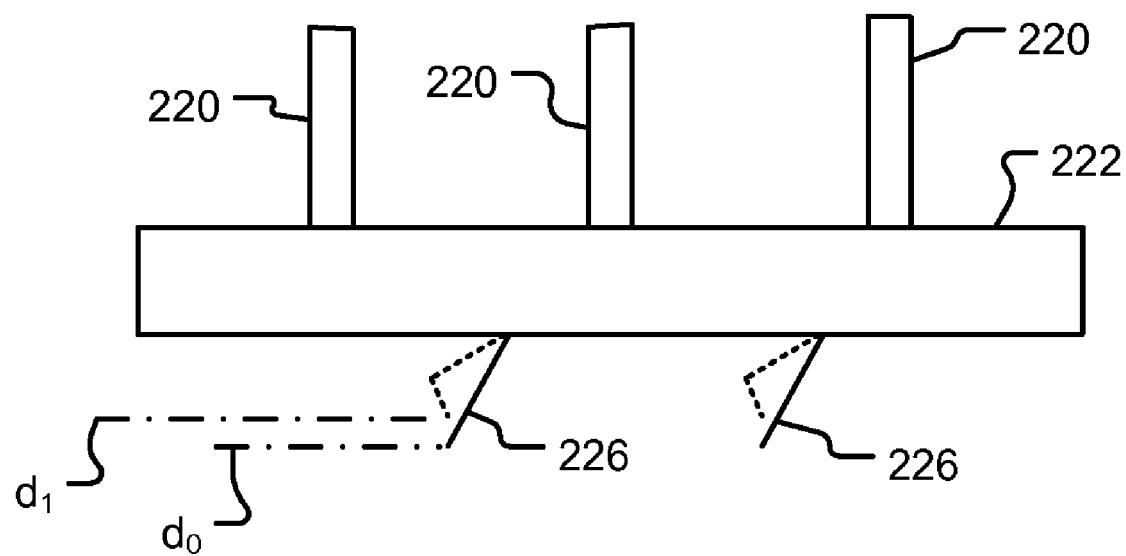

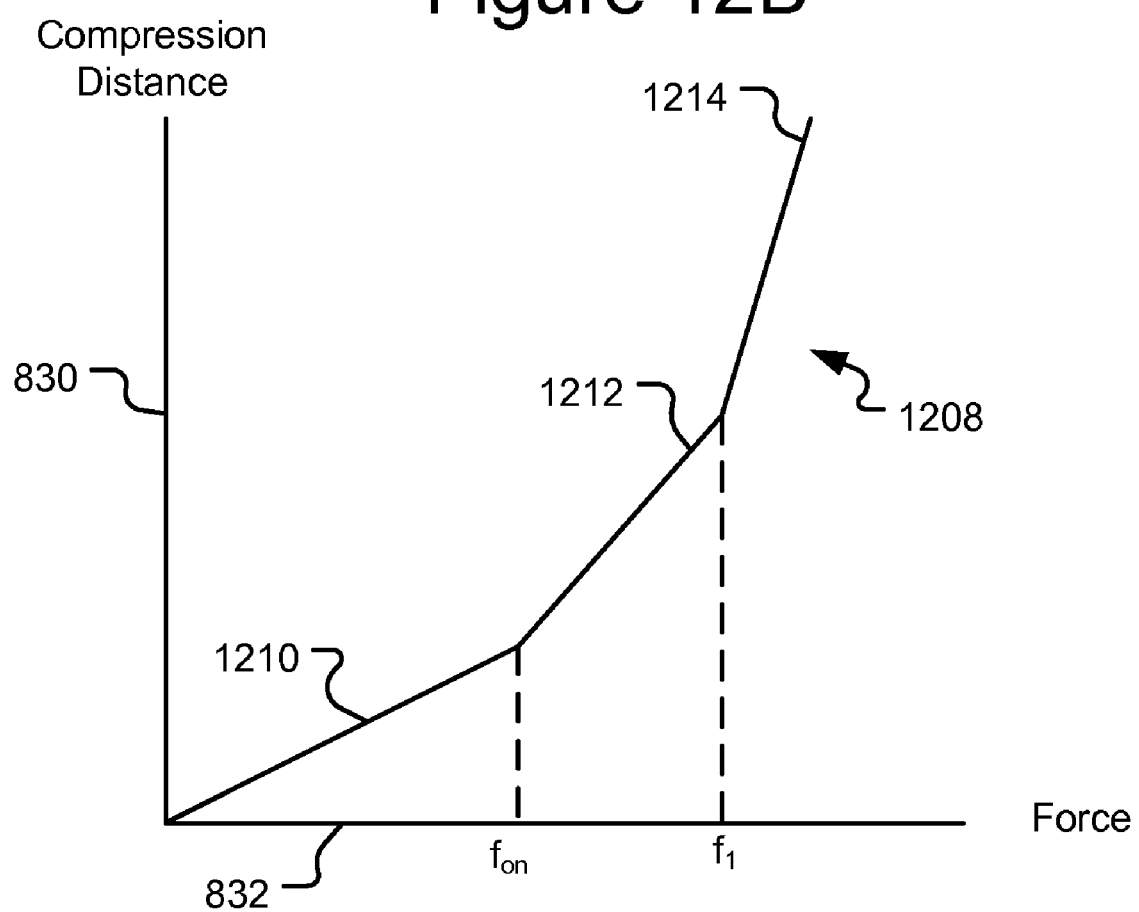

METHOD AND APPARATUS FOR PROVIDING ACTIVE COMPLIANCE IN A PROBE CARD ASSEMBLY

BACKGROUND

FIG. 1A illustrates a contactor device 102, which can be used to establish temporary, pressure based electrical connections with an electronic device 106. Temporary electrical connections between the terminals 108 and the probes 104 can be established by pressing the terminals 108 against the probes 104 and/or pressing the probes 104 against the terminals 108. Typically, the probes 104 can be compliant (i.e., flexible and thus able to move or displace upon application of a force) and can thus absorb forces arising from the pressing of the terminals 108 and probes 104 together.

The need for such compliance can arise from a number of sources.

One such source is over travel, an example of which is illustrated in FIGS. 1B and 1C. As shown in FIG. 1B, input and/or output terminals 108 of the electronic device 106 are brought into contact with electrically conductive probes 104 of the contactor device 102. Location 110 identifies first contact between the terminals 108 and the probes 104. As shown in FIG. 1C, the electronic device 106 is typically moved beyond first contact 110 between the terminals 108 and the probes 104 by a distance 112 that is typically referred to as "over travel." Over travel can, among other things, compensate for irregularities in the probes 104 and the terminals 108 (e.g., slight differences in the heights of the terminals 108, the terminals 108 being out of planarity with the probes 104, etc.) and ensure that the electrical connections between the probes 104 and the terminals 108 are sufficiently conductive for test signals to be reliably input through ones of the probes 104 into terminals 108 of the electronic device 106.

Consistent with the laws of physics, the over travel, including associated forces, must be absorbed or compensated for. As mentioned, typically, the probes 104—which can be compliant—of the contactor device 102 absorb most if not all of the over travel. In FIG. 1C, the probes 104 are shown compressed, having absorbed most if not all of the over travel 112. Under some circumstances, over compression of the probes 104 can damage the probes 104 and/or the electronic device 106.

Another source giving rise to the need for compliance is thermally induced movement of the contactor device 102 while the terminals 108 are pressed against the probes 104. For example, thermal gradients can develop across the contactor device 102, which can cause the contactor device 102 to warp, bow, or other wise move, which can affect the level of the forces between the probes 104 and the terminals 108.

BRIEF DESCRIPTION OF THE DRAWINGS

FIG. 2 illustrates an exemplary test system according to some embodiments of the invention.

FIGS. 9A-11B illustrate exemplary implementation of the process of FIG. 8 according to some embodiments of the invention.

FIGS. 12A and 12B illustrates another exemplary implementation of the process of FIG. 8 according to some embodiments of the invention.

DETAILED DESCRIPTION OF EXEMPLARY EMBODIMENTS

Figure 1A:
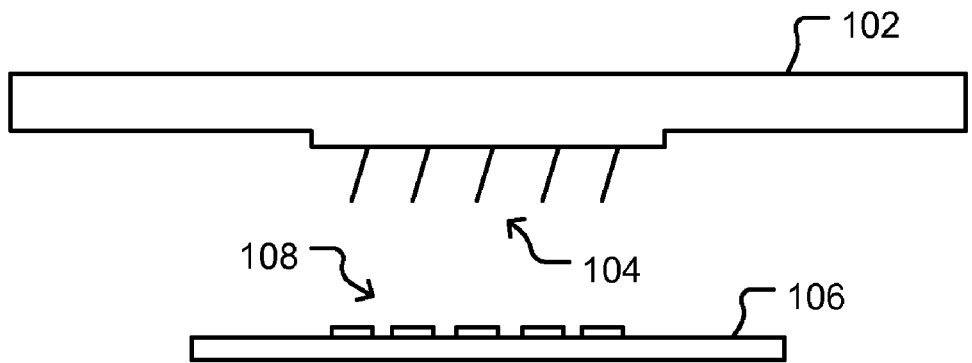
FIGS. 1A-1C illustrate a contactor device with probes for making electrical connections with an electronic device to be tested.

This specification describes exemplary embodiments and applications of the invention. The invention, however, is not limited to these exemplary embodiments and applications or to the manner in which the exemplary embodiments and applications operate or are described herein. Moreover, the Figures may show simplified or partial views, and the dimensions of elements in the Figures may be exaggerated or otherwise not in proportion for clarity. In addition, as the term "on" is used herein, one object (e.g., a material, a layer, a substrate, etc.) can be "on" another object regardless of whether the one object is directly on the other object or there are one or more intervening objects between the one object and the other object. Also, directions (e.g., above, below, top, bottom, side, "x," "y," "z," etc.), if provided, are relative and provided solely by way of example and for ease of illustration and discussion and not by way of limitation.

FIG. 2 illustrates a simplified, block diagram of an exemplary test system 200 for testing one or more electronic devices 230 according to some embodiments of the invention. (Hereinafter, one or more electronic devices to be tested will be referred to as "device under test" or "DUT." Moreover, "device under test" or "DUT" 230 can be one or more dies of an unsingulated semiconductor wafer, one or more semiconductor dies singulated from a wafer (packaged or unpackaged), one or more dies of an array of singulated semiconductor dies disposed in a carrier or other holding device, one or more multi-die electronics modules, one or more printed circuit boards, or any other type of electronic device or devices. Moreover, DUT can refer to one or more such devices.

As shown, test system 200 can include a tester 202, which can be a programmed general purpose computer, a special purpose computer, and/or other electronics or electronic devices. The tester 202 can be configured to generate test signals to be input into DUT 230, and the tester 202 can also be configured to receive and analyze response signals generated by DUT 230 in response to the test signals.

As also shown in FIG. 2, the test system 200 can include a housing 212 with a moveable holder 232 for holding and moving DUT 230. The housing 212 can be, for example, a prober such as is commonly used in testing semiconductor dies, and the holder 232 can be a chuck or stage. The holder 232 can be configured to hold DUT 230 and can also be configured to move DUT 230. For example, the holder 232 can be configured to move DUT 230 in the "x," "y," and "z" directions. The holder 232 can be further capable of tilting DUT 230 about the "x" and "y" axes and rotating DUT 230 about the "z" axis. (The "y" axis in FIG. 2 is into and out of the page. The "y" axis is shown slightly askew for ease of illustration.)

As also shown in FIG. 2, the test system 200 can include a probe card assembly 234 comprising electrically conductive probes 226 disposed to contact and thereby make electrical connections with input and/or output terminals 228 of DUT 230. As shown, the probe card assembly 234 can be attached to a mounting plate 210 of the housing 212, and the holder 232 can move DUT 230 along the "x, y" axes to align ones of the terminals 228 with ones of the probes 226 and then move DUT 230 along the "z" axis to bring the ones of the terminals 228 into contact with the ones of the probes 226.

As shown in FIG. 2, the probe card assembly 234 can comprise a mounting structure 236, a wiring substrate 208, a flexible electrical connector 218, and a probe head assembly 222 that includes the probes 226. Probes 226 can be resilient, conductive structures. Non-limiting examples of suitable probes 226 include composite structures formed of a core wire bonded to a conductive terminal (not shown) on the probe head assembly 222 that is over coated with a resilient material as described in U.S. Pat. No. 5,476,211, U.S. Pat. No. 5,917,707, and U.S. Pat. No. 6,336,269. Probes 226 can alternatively be lithographically formed structures, such as the spring elements disclosed in U.S. Pat. No. 5,994,152, U.S. Pat. No. 6,033,935, U.S. Pat. No. 6,255,126, U.S. Pat. No. 6,945,827, U.S. Patent Application Publication No. 2001/0044225, and U.S. Patent Application Publication No. 2004/0016119. Still other non-limiting examples of probes 226 are disclosed in U.S. Pat. No. 6,827,584, U.S. Pat. No. 6,640,432, U.S. Pat. No. 6,441,315, and U.S. Patent Application Publication No. 2001/0012739 (P130-US). Other non-limiting examples of probes 226 include conductive pogo pins, bumps, studs, stamped springs, needles, buckling beams, etc.

The wiring substrate 208 can include an electrical interface (not shown) to communications channels 204 from the tester 202. The communications channels 204 can provide a plurality of individual communications paths for providing from the tester power and ground to power DUT 230 and test signals for input into DUT 230, and for providing to the tester response signals generated by DUT 230 in response to the test signals. Ones of the communications channels 204 can also be used to provide control or status signals to or from the probe card assembly 234 or other devices (not shown) in or on the housing 212. For example, ones of the communications channels can be used to control movement of the holder 232. Communications channels 204 can comprise coaxial cables, fiber optics, wireless transmitters/receivers, switches, drives and receivers, among other things, or a combination of two or more of the foregoing. The electrical interface (not shown) between the channels 204 and the wiring substrate 208 can comprise any suitable means of making electrical connections with the channels 204. For example, the electrical interface (not shown) can comprise zero-insertion-force electrical connectors, pogo pin pads, etc. on the wiring substrate 208.

The wiring substrate 208 can comprise a plurality of electrical paths (not shown) from the channels 204 to the flexible electrical connector 218. The wiring substrate 208 can comprise, for example, a printed circuit board, and the electrical paths can comprise electrically conductive traces (not shown) on or within the wiring substrate 208 and electrically conductive vias (not shown) through the wiring substrate 208.

The flexible electrical connector 218 can provide flexible electrically conductive paths (not shown) from the wiring substrate 208 to the probe head assembly 222. The flexible electrical connector 218 can comprise any type of electrical connections that are sufficiently flexible (or compliant) to maintain electrical connections between the wiring substrate 208 and the probe head assembly 222 even as the probe head assembly 222 is moved by actuators 215, as will be discussed. For example, electrical connector 218 can comprise flexible wires. As another example, electrical connector 218 can comprise an interposer (e.g., like the interposer 504 disclosed in FIG. 5 of U.S. Pat. No. 5,974,622).

The probe head assembly 222 can include electrically conductive paths (not shown) through the probe head assembly 222 to the probes 226. The conductive paths (not shown) through the wiring substrate 208, the flexible electrical connector 218, and the probe head assembly 222 can thus provide individual electrical connections between ones of the channels 204 and ones of the probes 226, which in turn make electrical connections with ones of DUT terminals 228.

The probe head assembly 222 can take many different forms and designs. For example, the probe head assembly 222 can comprise a single substrate to which probes 226 are attached. Alternatively, the probe head assembly 222 can comprise a plurality of probe substrates (not shown) to which the probes 226 are attached, and those probe substrates can be attached to a larger substrate (not shown) or otherwise attached to each other. Examples of multiple substrate probe head assemblies 222 are disclosed in U.S. patent application Ser. No. 11/165,833, filed Jun. 24, 2005.

The mounting structure 236 can comprise a rigid structure (e.g., a metal plate structure) and a mechanism or mechanisms (not shown) that can be attached to and detached from the mounting plate 210. Non-limiting examples of such attachment mechanisms include bolts, screws, clamps, etc. As an alternative to the configuration shown in FIG. 2, wiring substrate 208—rather than the mounting structure 236—can be attached to the mounting plate 210. In such a configuration, the mounting structure 236 can be attached to the wiring substrate 208 as a stiffener structure, or the mounting structure 236 need not be included in the probe card assembly 234.

As shown in FIG. 2, the probe card assembly 234 can also include a plurality of actuators 215 each comprising, for example, an engine 214 and a drive mechanism 220. The drive mechanism 220 can be a movable element, and the engine 214 can be configured to move the drive mechanism 220. The engine 214 can be a motor (e.g., an electric motor) or any other device capable of moving the drive mechanism 220. (Although three actuators 215 are shown in FIG. 2, more or fewer can be used.) Each engine 214 can selectively drive its associated drive mechanism 220 toward the probe head assembly 222 or retract the drive mechanism 220 away from the probe head assembly 222. The engine 214 can be controlled by control signals 238. Each actuator 215 can thus be selectively controlled to move a portion of the probe head assembly toward or away from the mounting structure 236.

Figure 3:
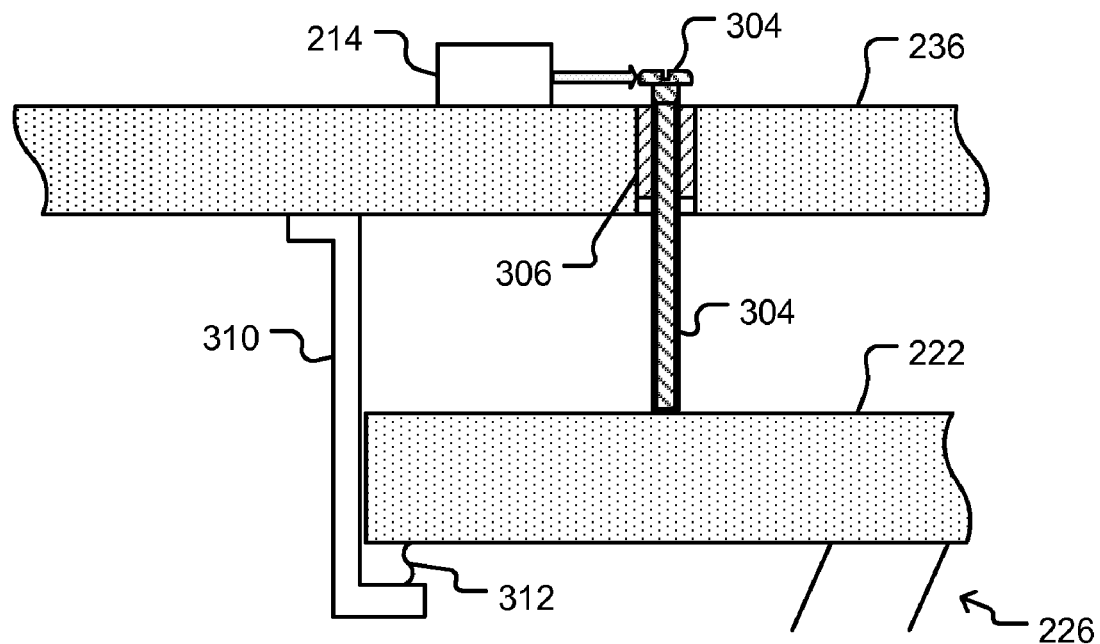
FIG. 3 illustrates an exemplary actuator according to some embodiments of the invention.

FIG. 3 illustrates an exemplary actuator (215) in which the drive mechanism (220) can comprise a bolt 304 according to some embodiments of the invention. In FIG. 3, mounting structure 236 (which can comprise a metal plate) is shown in partial view as is probe head assembly 222. For ease of illustration, the flexible electrical connector 218 and wiring substrate 208 are not shown in FIG. 3. A bracket 310 can attach the probe head assembly 222 to the mounting structure 236, and springs 312 (one is shown but more can be provided) can bias the probe head assembly 222 toward the mounting structure 236. The bolt 304 can thread into a threaded plug 306 (e.g., a threaded bushing) in the mounting structure 236 as shown. (The threaded plug 306 can be replaced by threading formed directly into a hole in the mounting structure 236. The associated engine 214 can selectively rotate the bolt 304. As the engine 214 rotates the bolt 304 in one direction, the bolt 304 can move toward the probe head assembly 222 and press against the probe head assembly 222, moving the probe head assembly 222 away from the mounting plate 236 against the biasing force of springs 312. In contrast, as the engine 214 rotates the bolt 304 in an opposite direction, the bolt 304 can move away from the probe head assembly 222, allowing the biasing force of the springs 312 to push the probe head assembly 222 toward the mounting structure 236.

Figure 4:
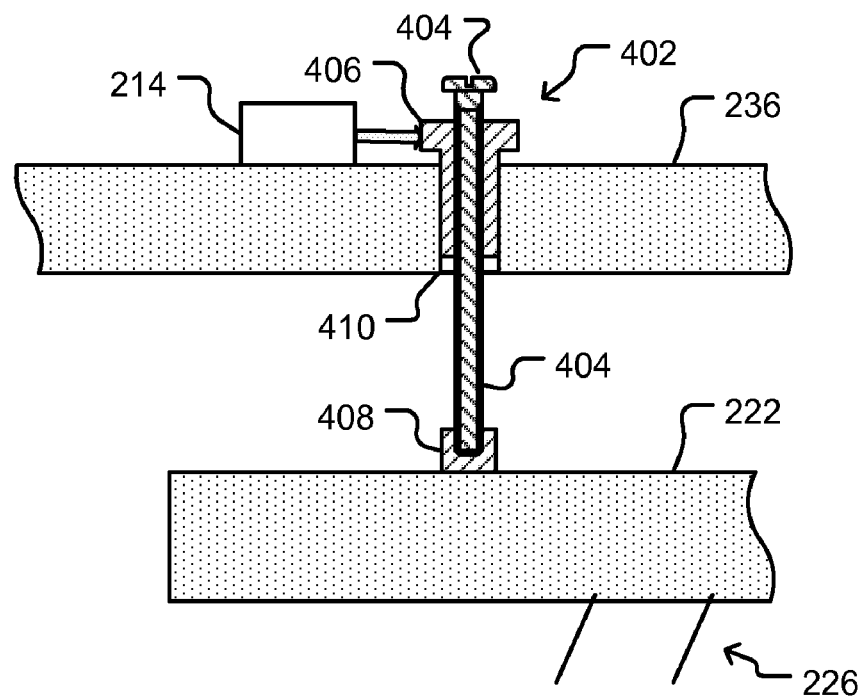
FIG. 4 illustrates another exemplary actuator according to some embodiments of the invention.

FIG. 4 illustrates an exemplary actuator (215) in the form of a differential screw assembly 402 and engine 214 according to some embodiments of the invention. As in FIG. 3, the mounting structure 236 and probe head assembly 222 are shown in partial view, and the flexible electrical connector 218 and wiring substrate 208 are not shown. As shown in FIG. 4, the differential screw assembly 402 can comprise an inner screw element 404 that is threaded into an outer screw element 406. The outer screw element 406 can itself be threaded into a threaded hole 410 in the mounting structure 236 (or a threaded plug (e.g., a threaded bushing)), and an end of the inner screw element can be threaded into a stud element 408 attached to the probe head assembly 222. Alternatively, the inner screw element 404 can be snapped, brazed, welded, or otherwise attached to the stud element 408. As yet another alternative, the inner screw element 404 and the stud element 408 can be integrally formed.

The associated engine 214 can selectively rotate the outer screw element 406. As the outer screw element 406 is rotated in one direction, the probe head assembly can be pushed away from the mounting structure 236, and as the outer screw element 406 is rotated in the opposite direction, the probe head assembly 222 can be pulled toward the mounting structure 236.

The exemplary actuators 215 shown in FIGS. 3 and 4 are but two examples of many possible actuators that can be used. Other non-limiting examples include a fine pitch screw with a gearbox, a pneumatic actuator, a thermal actuator, a hydraulic actuator, a piezoelectric actuator, a linear motor, a voice coil actuator solenoid, a magnetostriction actuator (e.g., a terfenol-D actuator), a linear motor actuator driving a wedge system, a shape memory alloy (e.g., Nitinol), etc.

Figure 5:
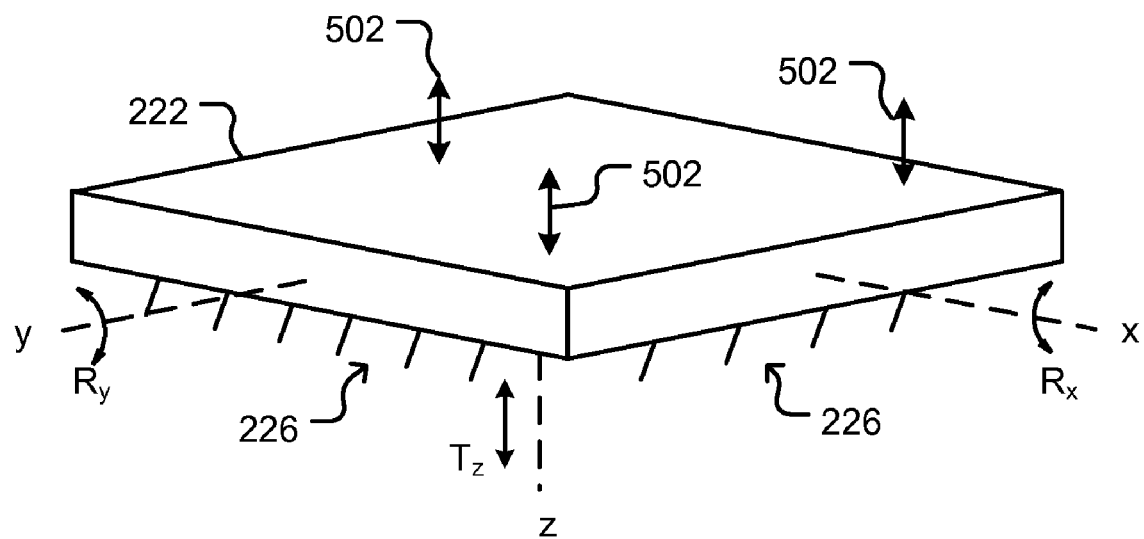
FIG. 5 illustrates the probe head assembly of the exemplary probe card assembly shown in FIG. 2 according to some embodiments of the invention.

Referring to FIG. 5 (which shows only the probe head assembly 222), regardless of the configuration or type of the actuators 215, by utilizing a plurality of actuators 215, forces 502 can be selectively applied by each drive mechanism 220 to different regions of the probe head assembly 222. As also shown in FIG. 5, by selective application of forces 502, the probe head assembly 222 can be translated along the "z" axis and/or rotated about the "x" axis and/or the "y" with respect to the mounting structure 236 (see FIG. 2). If more than three actuators 215 are used, the probe head assembly 222 can be bent or distorted, and other motions are also possible.

Figure 1B:
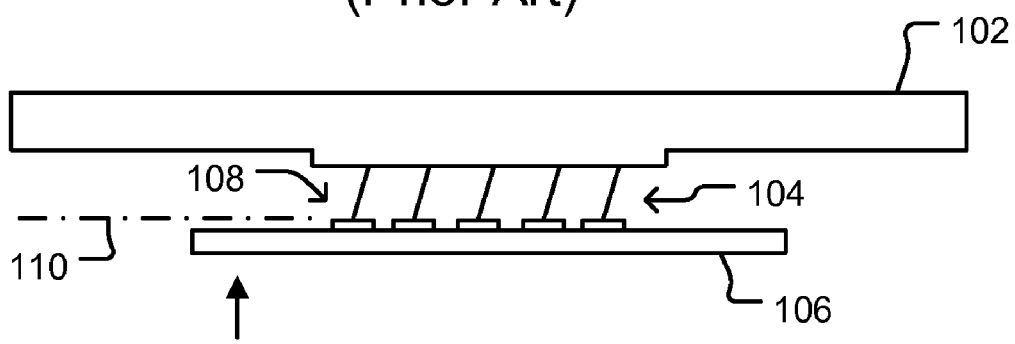
Figure 1C:
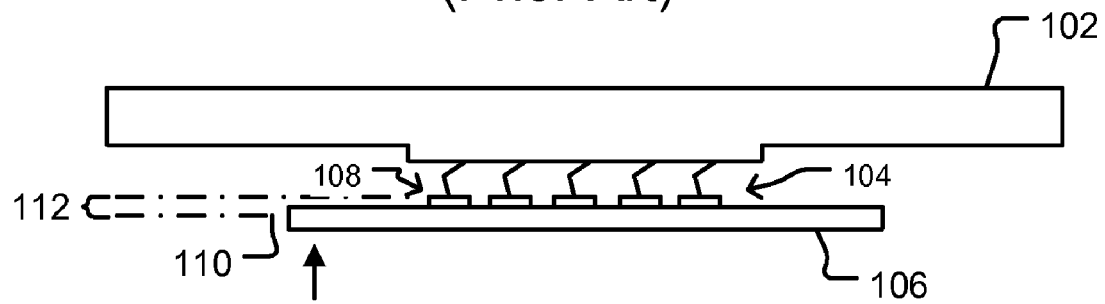

To test DUT 230 using the test system 200 of FIG. 2, the holder 232 can align terminals 228 of DUT 230 with probes 226 of the probe card assembly 234. The holder 232 can do so by moving DUT 230 generally along the "x" and "y" axes. The holder 323 can then move DUT 230 toward the probe card assembly 234 generally along the "z" axis. The holder 232 can continue moving DUT 230 along the "z" axis past first contact between the terminals 228 and the probes 226 by a distance typically referred to as the over travel distance, consistent with the above discussion regarding FIGS. 1A-1C, which illustrates an example of over travel 112. Particular test scenarios may require a minimum over travel of the terminals 228 past first contact with the probes 226 to compensate for irregularities in the terminals 228 and/or the probes 226 and orientation mismatches between the terminals 228 and the probes 226 (e.g., the probes 226 are oriented in a different plane than the plane in which the terminals 228 are oriented). Over travel, as well as other factors (e.g., thermal gradients), can place a total compliance demand on the probe card assembly 234, which may necessarily need to be absorbed by the probe card assembly 234. The probes 226 can be resilient spring-like probes and can thus absorb at least some of the over travel. Depending on the size and material composition of the probes 226, however, the probes 226 may not be strong enough to provide the total compliance demand placed on the probe card assembly 234. For example, the over travel may compress the probes 226 beyond the elastic limits of the probes 226. As another example, thermally induced movement of the probe card assembly 234 can push the total compliance demand on the probe card assembly past the elastic limits of the probes 226.

Still referring to FIG. 2, in accordance with some embodiments of the invention, the probe card assembly 234 can include a sensor 224 (although one is shown more can be used (e.g., in some embodiments three or more can be used)) configured to sense one or more parameters indicative of a compliance demand being placed on the probe card assembly 234 (e.g., due to over travel of DUT terminals 228 beyond first contact with the probes 226, warping, bending, or other movement of the probe card assembly due to thermal gradients or loading), and the probe card assembly can also include a controller 216 configured to control movement of one or more of the actuators 215 and thus move the probe head assembly 222 in order to apportion part of the compliance demand to movement of the probe head assembly 222 by the actuators 215. Put another way, movement of the actuators 215 provides a second source of compliance that, with the probes 226 (which can be said to provide a first source of compliance), meets the total compliance demand placed on the probe card assembly 234.

Figure 6:
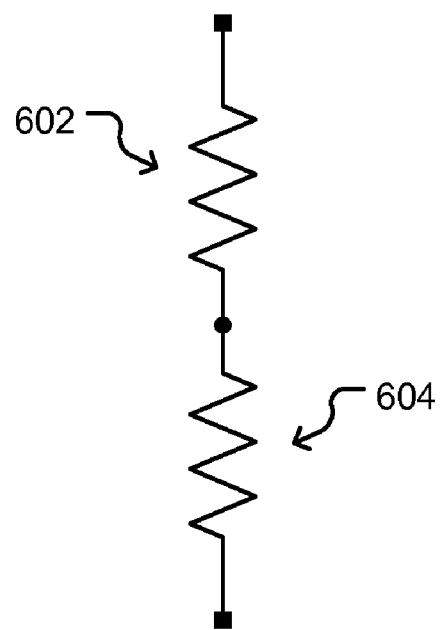
FIG. 6 illustrates virtual springs that represent compliance contributions provided to the probe card assembly shown in FIG. 2 by the actuators and the probes.

FIG. 6 illustrates a schematic diagram of two virtual springs 602, 604 in series. The sum of the compliance provided by the two virtual springs 602, 604 can represent a total compliance demand placed on the probe card assembly 234 due to any of the factors discussed above (e.g., over travel, thermal movements, loading, etc.). Virtual spring 602 can represent a compliance contribution provided by the actuators 215 in moving the probe head assembly 222 under control of the controller 216. Virtual spring 604 can represent the compliance contribution of the probes 226, which as can be seen, can be less than the total compliance demand by the amount of compliance provided by the actuators 215 (represented by virtual spring 602).

As mentioned, the sensor 224 can be configured to sense one or more parameters indicative of a compliance demand being placed on the probe card assembly 234. For example, sensor 224 can sense levels of forces being applied to the probe head assembly 222. One example of a force sensor is a strain gauge. One or more strain gauges can be placed on or near one or more probes 226 and configured to produce an output signal or signals proportional or related to a level of force or forces on one or more of the probes 226. As another example, one or more force sensors can be configured to sense a force or forces applied by the probe head assembly 222 (e.g., in response to DUT terminals 228 being pressed against the probes 226) to one or more of the actuators 215. As yet another example of a force sensor, a force sensor can be configured to produce an output signal that is proportional or related to a force resisting operation of an actuator 215. Sensor 224 need not, however, be a force sensor. Other examples of suitable sensors 224 include sensors for sensing distances between portions of the probe head assembly 222 and corresponding portions of DUT 230. Such distances can be correlated to forces in or on the probes 226. Examples of distance sensors include capacitive sensors and air gap sensors. Still other examples of suitable sensors 224 include sensors for determining contact between DUT terminals 228 and particular ones of the probes 226 located on particular regions of the probe head assembly 222. Some of the foregoing sensors can be non-linear. For example, capacitive sensors can be non-linear.

As shown in FIG. 2, signals 240 generated by sensor 224 can be output to the controller 216. The controller 216 can be configured to determine a total compliance demand being placed on the probe card assembly 234, and the controller 216 can be configured to allocate a portion of the total compliance demand to movement of the probe head assembly 222 by the actuators 215. The controller 216 can then output control signals 238 to the actuators 215 to move the drive mechanism 220, which in turn moves the probe head assembly 222, allocating some of the total compliance demand to movement of the probe head assembly 222 by the actuators 215.

For example, the controller 216 can be configured to determine whether the total compliance demand exceeds a threshold (e.g., a maximum amount of compliance that the probes 226 can safely provide). As another example, the controller 216 can be configured to determine a total compliance demand being placed on the probe card assembly 234, and the controller 216 can be configured to apportion part (e.g., a predetermined level of compliance, a predetermined percentage of the total compliance, etc.) of the total compliance demand to the probes 226, and can output control signals 238 to the engines 214 to move the actuators 215, which in turn moves the probe head assembly 222, providing another portion (e.g., the portion not allocated to the probes 226) of the total compliance demand. The controller 216 can thus be configured to apportion the total compliance demand between the probes 226 and movement of the probe head assembly 222.

Figure 7:
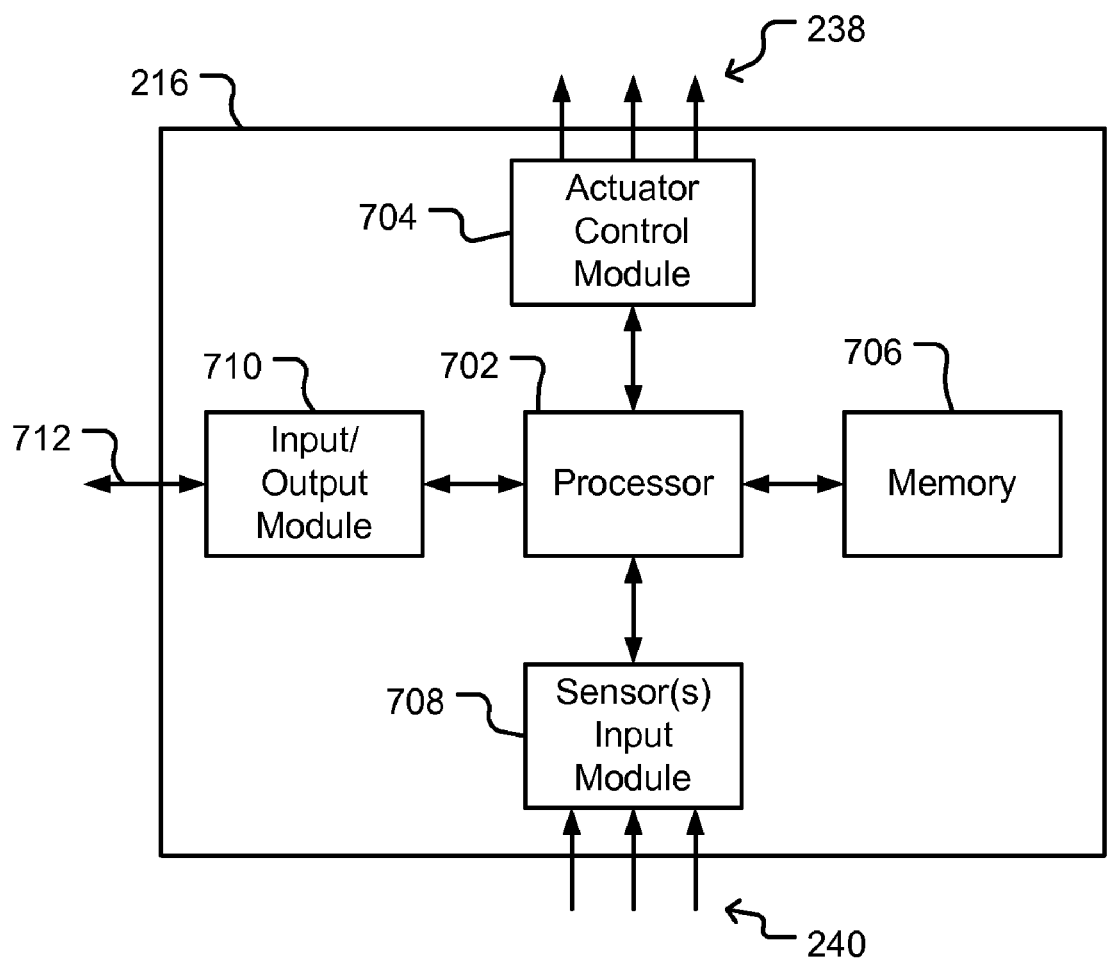
FIG. 7 illustrates an exemplary configuration of the controller shown in FIG. 2 according to some embodiments of the invention.

FIG. 7 illustrates an exemplary configuration of controller 216 according to some embodiments of the invention. As shown, controller 216 can comprise a processor 702, which can be a processor 702 configured to operate under control of software, which can be stored in a memory 706. (As used herein, the term "software" includes without limitation software, firmware, microcode, or any other machine readable code that can be executed by a processor, such as processor 702.) Processor 702 and memory 706 can be replaced by hardwired logic circuits that perform the same or similar functionality as processor 702 operating under software control. As another alternative, processor 702 can comprise hardwired logic and can operate under control of the hardwired logic and software. Controller 216 can also comprise a sensor input module 708 configured to receive on or more signals 240 (three are shown but more or fewer can be used) output by one or more of sensors 224, and controller 216 can include an actuator control module 704 configured to output one or more control signals 238 (three are shown but more or fewer can be used) to the actuators 215. As shown, controller 216 can also include a general input/output module 710 for other input and/or output signals 712. Other modules and features (not shown) can also be included.

FIG. 7 is exemplary only, and other configurations of controller 216 are possible. For example, controller 216 can comprise pneumatic elements configured to form a pneumatic computing system.

Figure 8:
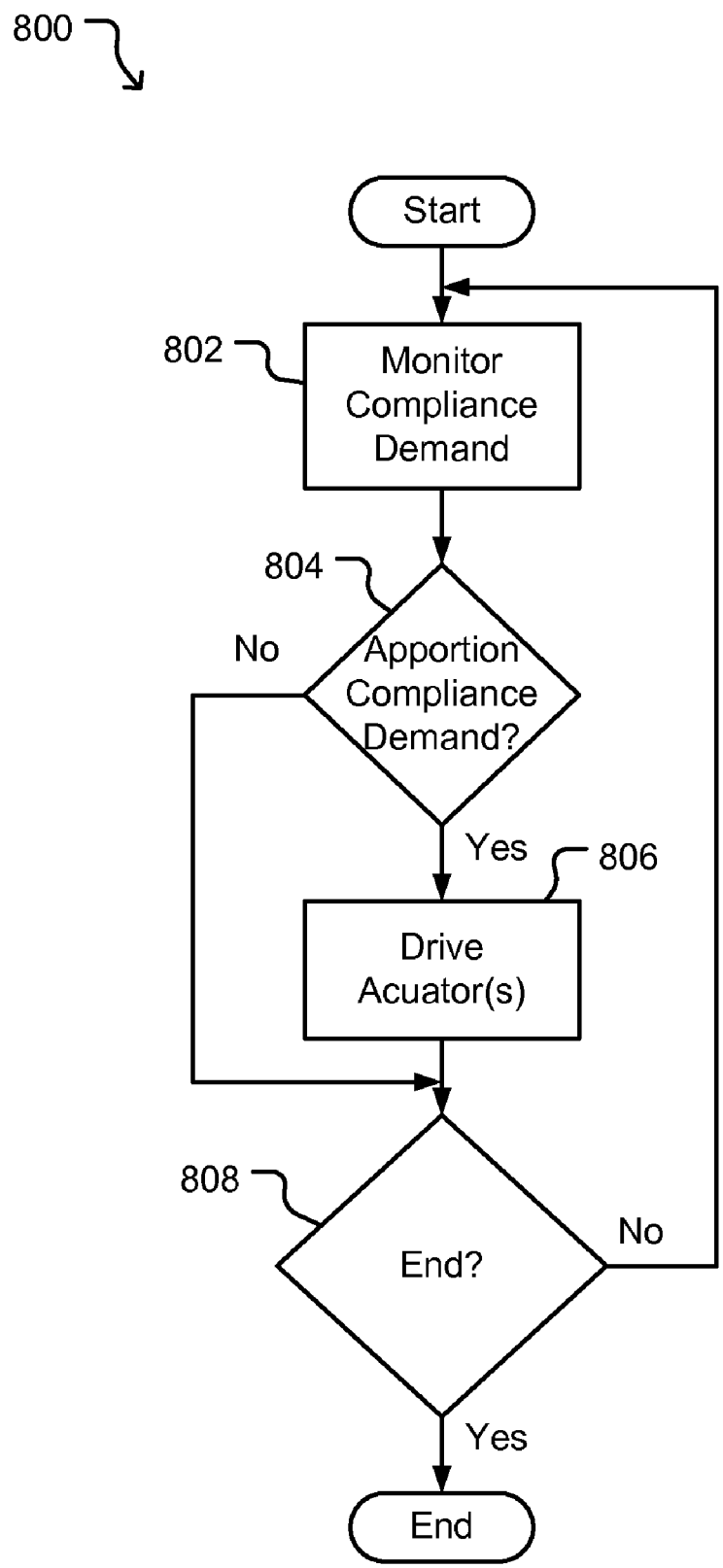
FIG. 8 illustrates an exemplary process that can be executed by the controller of FIG. 7 according to some embodiments of the invention.

FIG. 8 illustrate an exemplary process 800 that can be implemented by the controller 216 according to some embodiments of the invention. The process 800 can be executed during testing of a DUT, like DUT 230, in a test system, like test system 200. For ease of discussion and illustration, the process 800 will be discussed herein with regard to testing DUT 230 in test system 200, although the process 800 can be implemented during testing of other DUTs in other test systems.

The testing of DUT 230 during which process 800 can be implemented can be as follows. DUT 230 can be placed on the holder 232 in the housing 212 of the test system 200 of FIG. 2, the holder 232 can move DUT 230 along the "x, y" axes as needed to align ones of DUT terminals 228 with ones of the probes 226. The holder 232 can then move DUT 230 generally along the "z" axis toward the probes 226 past first contact between the terminals 228 and the probes 226 by an over travel distance, as discussed above. The contact can establish electrical connections between the probes 226 and the terminals 228. The tester can then generate test signals that are provided through the channels 204 and the probe card assembly 234 to DUT 230. Response signals generated by DUT 230 in response to the test signals can be provided through the probe card assembly 234 and the channels 204 to the tester 202, which can analyze the response signals to determine whether DUT 230 functioned properly. Prior to testing, one or more initialization procedures (not shown) can be performed on or within the test system 200, and such initialization procedures can include initial partial or full runs of test procedures at reduced or full speeds.

Before or after starting the foregoing testing, controller 216 can begin the process 800 and continue to execute the process 800 during the testing. At 802, the controller 216 can monitor a compliance demand on the probe card assembly 234. The controller 216 can do so utilizing output signals 240 generated by the sensor 224. At 804, the controller 216 can determine whether to apportion some of the total compliance demand to movement of the probe head assembly 222 by the actuators 215. In other words, the controller 216 can determine whether to reduce the total compliance demand placed on the probes 226 by moving the probe head assembly 222. Put another way, movement of the actuators 215 can provide a second source of compliance that, with the probes 226 (which can be said to provide a first source of compliance), can meet the total compliance demand placed on the probe card assembly 234.

The controller 216 can perform 804 in any of several possible manners. For example, the controller 216 can determine whether the compliance demand exceeds a threshold value. The threshold value can be set to be a maximum compliance demand that the probes 226 can safely meet without significant risk of damaging the probes 226. The threshold value can thus depend on the design and construction of the probes 226, the materials that compose the probes 226, and other parameters relating to the probes 226, such as strength, elasticity, resilience, spring value, etc. The threshold value can alternatively or additionally depend on electrical characteristics of the probes 226. For example, the threshold value can depend, directly or indirectly, on a measured contact resistance of one or more of the probes 22.

As another example of how the controller 216 can determine whether to apportion compliance at 804, the controller 216 can be configured to apportion at 804 a predetermined percentage of the total compliance demand determined at 802 to the probes 226. A remaining portion of the total compliance demand can be apportioned to moving the probe head 222, as generally discussed above. As another alternative, the controller 216 can apportion a predetermined percentage of the total compliance demand to moving the probe head 222. As still other alternatives, the controller 216 can be configured to apportion at 804 a predetermined level of compliance to either the probes 226 or moving the probe head assembly 222 and to apportion at 804 the balance of the total compliance demand to the other of the probes 226 or the probe head assembly 222. If the controller 216 is configured to apportion a percentage or a predetermined amount of the total compliance demand to either the probes 226 or moving the probe head assembly 222, the process 800 of FIG. 8 can be configured to always branch in accordance with a "yes" determination at 804.

If the controller 216 determines at 804 to apportion the compliance demand monitored at step 802, the controller 216 at 806 can output control signals 238 to the actuators 215 to move the probe head assembly 222 to apportion the total compliance demand determined at 802 between the probes 22 and moving the probe head assembly 222 (which can effectively reduce the compliance demand that would otherwise be placed on the probes 226). As discussed above, the actuators 215 can thus be driven to move probe head assembly 222 and thereby provide a portion of the total compliance demand placed on the probe card assembly 234. The probes 226 thus need provide only a portion of the total compliance required of the probe card assembly 234. As discussed above with respect to FIG. 6, the probes 226 need provide only a portion of the total compliance demand (which is represented in FIG. 6 as the sum of virtual springs 602, 604), namely, the portion represented by virtual spring 604. This is because the actuators 215 can provide the portion of the compliance represented by virtual spring 602. Put another way, movement of the actuators 215 can provide a second source of compliance that, with the probes 226 (which can be said to provide a first source of compliance), meets the total compliance demand placed on the probe card assembly 234.

Referring again to the process 800 of FIG. 8, at 808, the process 800 can return to repeat 802, 804, 806, which can be repeated any number of times. Alternatively, at 808, the process 800 can end. Any number of criteria can be used to determine whether to end at 808 the process 800. For example, process 800 can end after electrical connections are established between the probes 226 and DUT terminals 228 by, as described above, moving DUT terminals 228 an over travel distance past initial contact with the probes 226. In such a case, actuators 215 can be used to provide some of the compliance needed to absorb the over travel.

As another example, process 800 can continue throughout testing of DUT 230. The end determination at 808 can thus coincide with the end of testing DUT 230. In such a case, process 800—and actuators 215—can provide additional compliance in response to events other than over travel of DUT terminals 228 past first contact with the probes 226. For example, temperature gradients across the probe card assembly 234 can change during testing, which can cause thermally induced movement (e.g., warping) of the probe card assembly, which can change the compliance demand on the probe card assembly. Such a change can be detected at 802, 804 and compensated for at 806. As yet another example of a criterion for ending the process 800 at 808, the determination to end at 808 can be based on a signal, such as an end signal produced when a user activates a stop procedure.

There are any number of ways in which the controller 216 can monitor a compliance demand at 802, determine whether to apportion some of the compliance demand to the actuators 215 at 804, and drive the actuators 215 to apportion the compliance demand at 806. FIGS. 9A-12B illustrate non-limiting examples.

Figure 9A:
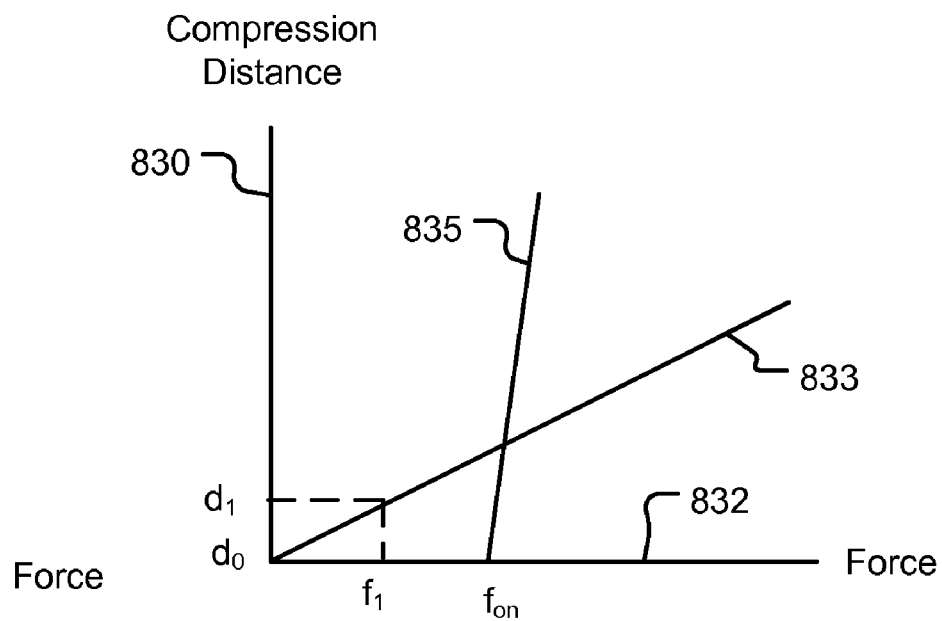
Figure 9B:
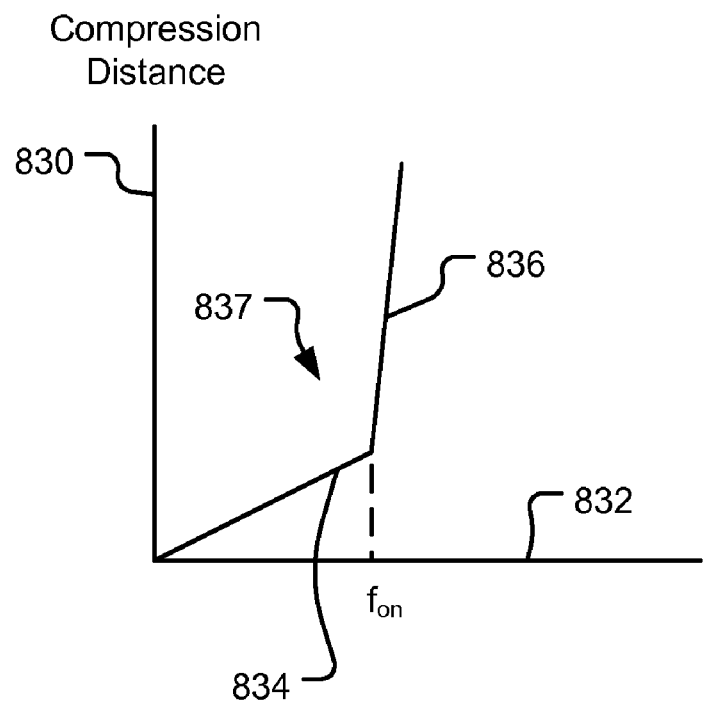

FIGS. 9A and 9B show exemplary graphs of compression distance verses force, which can represent exemplary operation of controller 216 in executing 802, 804, 806 of the process 800 of FIG. 8.

In FIG. 9A, the vertical axis 830 (labeled compression distance) can represent a distance by which a probe 226 is compressed, and the horizontal axis 832 (labeled force) can represent a corresponding force on probe 226. Line segment 833 can represent typical response of the probes 226 in general accordance with Hooke's law (e.g., f=k*d, where f is the force applied to a probe 226, k is the spring constant of the probe 226, d is the compression distance (along axis 830), and * represents multiplication). FIG. 10 illustrates an example. As illustrated in FIG. 10, probes 226 (which are represented in FIG. 10 schematically as lines but can take many actual shapes in actual practice) are shown in an uncompressed state with their ends (e.g., tips) located in a or an approximate plane represented by line $d_0$. (A plane corresponding to line do can extend into and out of the page of FIG. 10.) In FIG. 10, probes 226 in a compressed state are shown in dashed lines with their ends located in a plane or an approximate plane represented by line $d_1$. (A plane corresponding to line $d_1$ can extend into and out of the page of FIG. 10.) The distance $d_1$ in FIG. 10 can be a compression distance $d_1$ corresponding to the vertical axis 830 in FIG. 9A, and the resulting force on the probe 226 can be the force $f_1$ corresponding to the horizontal axis 832 in FIG. 9A.

In one non-limiting example, the controller 216 can be programmed to execute 802, 804, 806 of the process 800 of FIG. 8 in accordance with the line segment 835 shown in FIG. 9A. While the force on a probe or probes 226 is less than what is labeled $f_{on}$ in FIG. 9A, controller 216 can be configured not to drive the actuators 215, and the probes 226 can behave generally like springs in general accordance with Hooke's law (e.g., in accordance with line segment 833). That is, while the force on a probe or probes 226 is less than what is labeled $f_{on}$ in FIG. 9A, the compression distance of the probes 226 and the resulting force on the probes 226 can change in proportion to each other as illustrated by line segment 833. Once the force on one or more of probes 226 exceeds $f_{on}$, however, controller 216 can be configured to drive the actuators 215 to move the probe head assembly 222. In accordance with the example illustrated in FIG. 9A, the controller 216 can be configured to drive the actuators 215 in accordance with line segment 835.

Figure 11A:
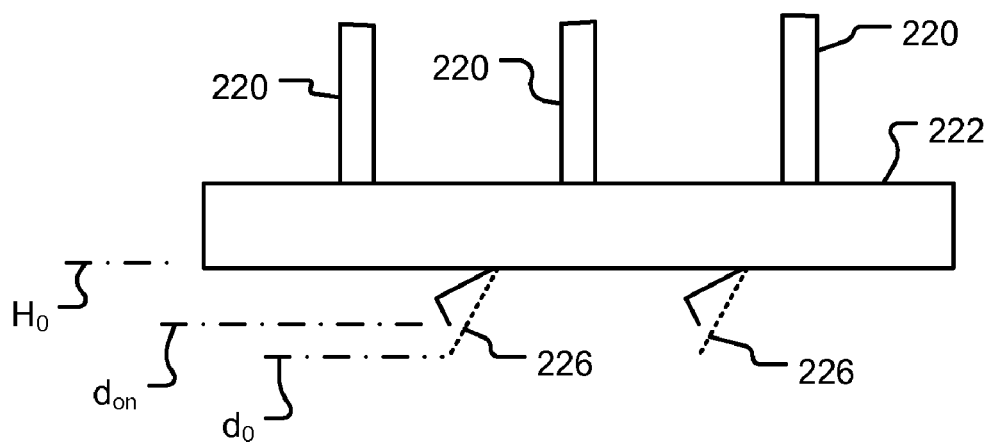
Figure 11B:
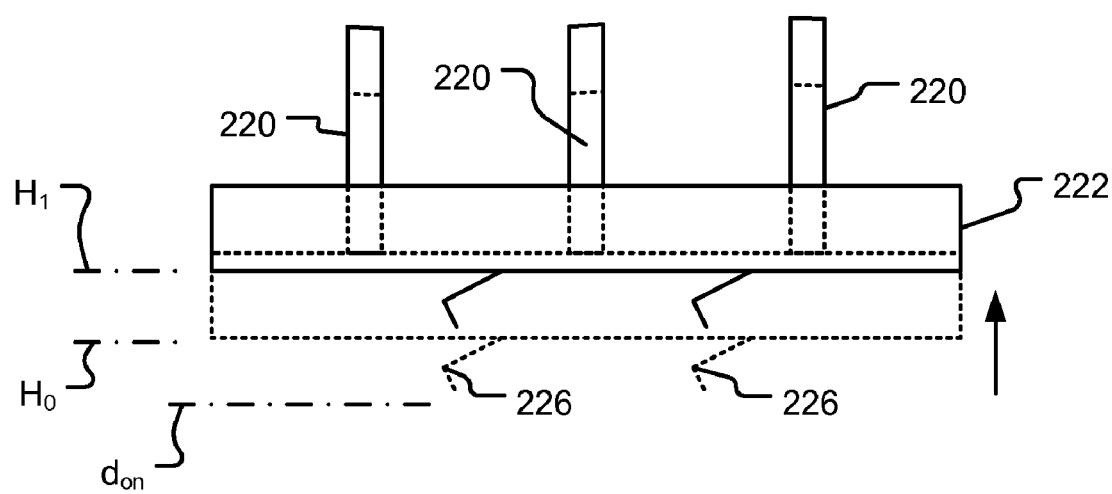

An example of the foregoing is illustrated in FIGS. 11A and 11B. As probes 226 are compressed from a compression distance of $d_0$ (i.e., no compression) to a compression distance of $d_{on}$, the probes 226 compress like springs in accordance with Hooke's law (e.g., in accordance with line segment 833 in FIG. 9A) as shown in FIG. 11A. As shown in FIG. 11B, if the force on the probes 226 exceeds $f_{on}$, the controller 216 can control actuators 215 and cause the actuators 215 to move the probe head assembly 222 in the direction of the compression. In FIG. 11B, the probe head assembly 222 is moved from an initial position $H_0$ to position $H_1$.

FIG. 9B illustrates combined response of the probes 226 and operation of actuators 215 from the perspective of a DUT (e.g., DUT 230) pressed against probes 226. In FIG. 9B, compound line 837 can represent the sum of line segments 833 and 835 of FIG. 9A. Because the 830 axis value of line segment 835 in FIG. 9A is zero for forces less than $f_{on}$, the first segment 834 of compound line 837 of FIG. 9B corresponds to line segment 833 in FIG. 9A, which corresponds to the response of the probes 236 by themselves. The second segment 836 of compound line 837 is the sum of line segments 833 and 835 in FIG. 9A and represents the combined response of the probes 236 in accordance with line segment 833 of FIG. 9A and operation of the actuators 215 in accordance with line segment 835 of FIG. 9A. In the specific non-limiting example shown in FIG. 9B, the slope of the line segment 835 (or in other words control of the actuators 215) can be selected so that nearly all of any increase in the force on the probes 226 past $f_{on}$ is offset by a corresponding movement of the probe head assembly 222 in the direction of the compression of the probes 226 so that the force on the probes 226 increases only slightly, which can approximate a constant force on the probes 226. Other slopes can, however, be selected for line segment 835, which can result in different corresponding slopes for the second segment 836 of the compound line 837.

Figure 12A:
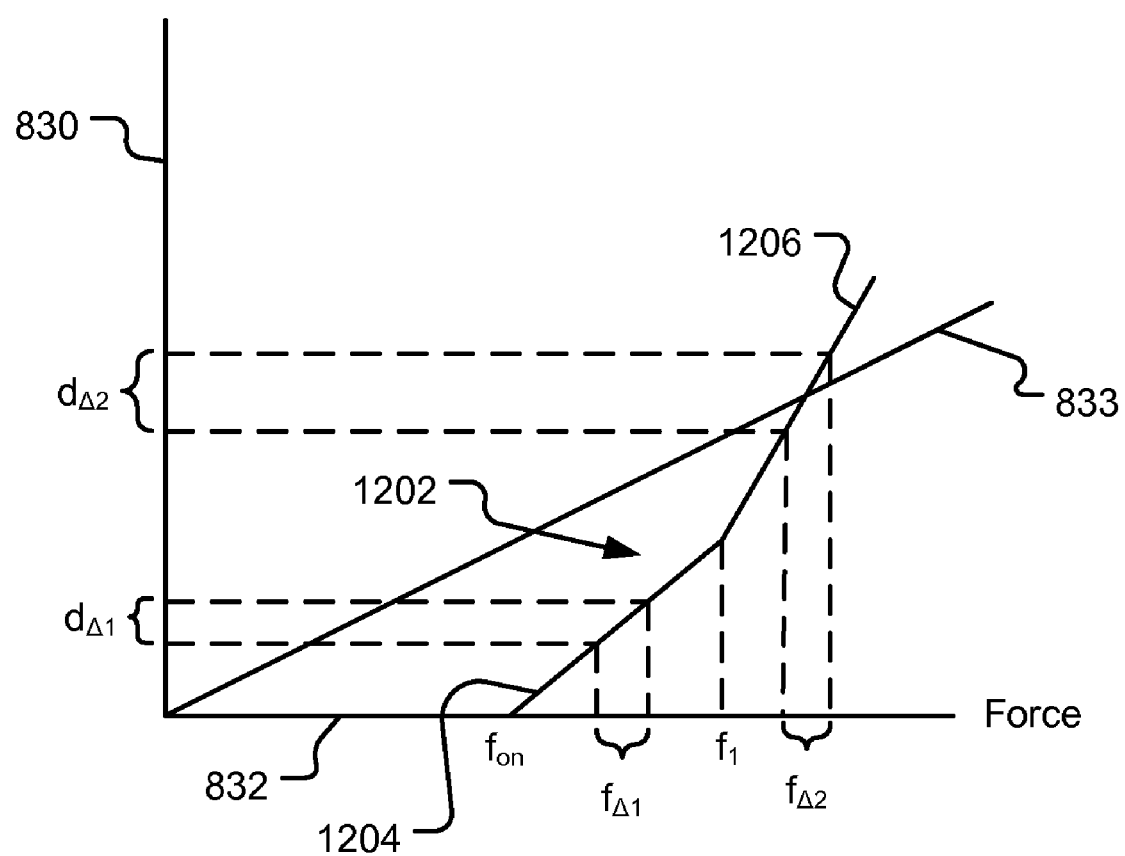

The function (represented by line segment 835 in FIG. 9A) illustrating exemplary control of actuators 215 is exemplary only, and many other functions can be substituted for the function represented by line segment 835. FIGS. 12A and 12B illustrate an example in which a compound function (represented by compound line 1202 in FIG. 12A, which comprises first segment 1204 and second segment 1206) represents control of actuators 215. In FIG. 12A, line segment 833 is the same as in FIG. 9A and represents response of the probes 226 by themselves in accordance with Hooke's law as discussed above.

Referring to compound line 1202 (which as discussed above, represents control of actuators 215) in FIG. 12A, while the force on the probes 226 is less than $f_{on}$, the controller 216 can be configured not to activate actuators 215. While the force on the probes 226 is between $f_{on}$ and $f_1$, the controller 216 can be configured to control the actuators 215 to move the probe head assembly 222 in accordance with first segment 1204. For example, the controller 216 can be configured to move the probe head assembly 222 a distance corresponding to $d_{A1}$ for every unit change in the force $f_{A1}$ on the probes 226. While the force on the probes 226 is greater than $f_1$, the controller 216 can be configured to control the actuators 215 in accordance with second segment 1206. For example, the controller 216 can be configured to move the probe head assembly 222 a distance corresponding to $d_{A2}$ for every unit change in the force $f_{A2}$ on the probes 226.

FIG. 12B illustrates combined response of the probes 226 and operation of actuators 215 from the perspective of a DUT (e.g., DUT 230) pressed against probes 226. In FIG. 12B, compound line 1208 can represent the sum of line segment 833 and the compound line 1202 of FIG. 12A. Because the 830 axis value of the compound line 1202 in FIG. 12A is zero for forces less than $f_{on}$, the first segment 1210 of compound line 1208 in FIG. 12B can correspond to line segment 833 in FIG. 12A, which as discussed above, can correspond to the response of the probes 236 by themselves. The second segment 1212 of compound line 1208 can be the sum of line segments 833 and first segment 1204 in FIG. 12A and can represent the combined response of the probes 236 in accordance with line segment 833 of FIG. 12A and operation of the actuators 215 in accordance with first segment 1204 of FIG. 12A while the force is between $f_{on}$ and $f_1$. The third segment 1214 of compound line 1208 can be the sum of line segments 833 and the second segment 1206 in FIG. 12A and can represent the combined response of the probes 236 in accordance with line segment 833 of FIG. 12A and operation of the actuators 215 in accordance with second segment 1206 of FIG. 12A while the force is greater than $f_1$.

Many other functions (including without limitation exponential functions) can be substituted for the function represented by line segment 835 in FIG. 9A or compound line 1202 in FIG. 12A.

Figure 15A:
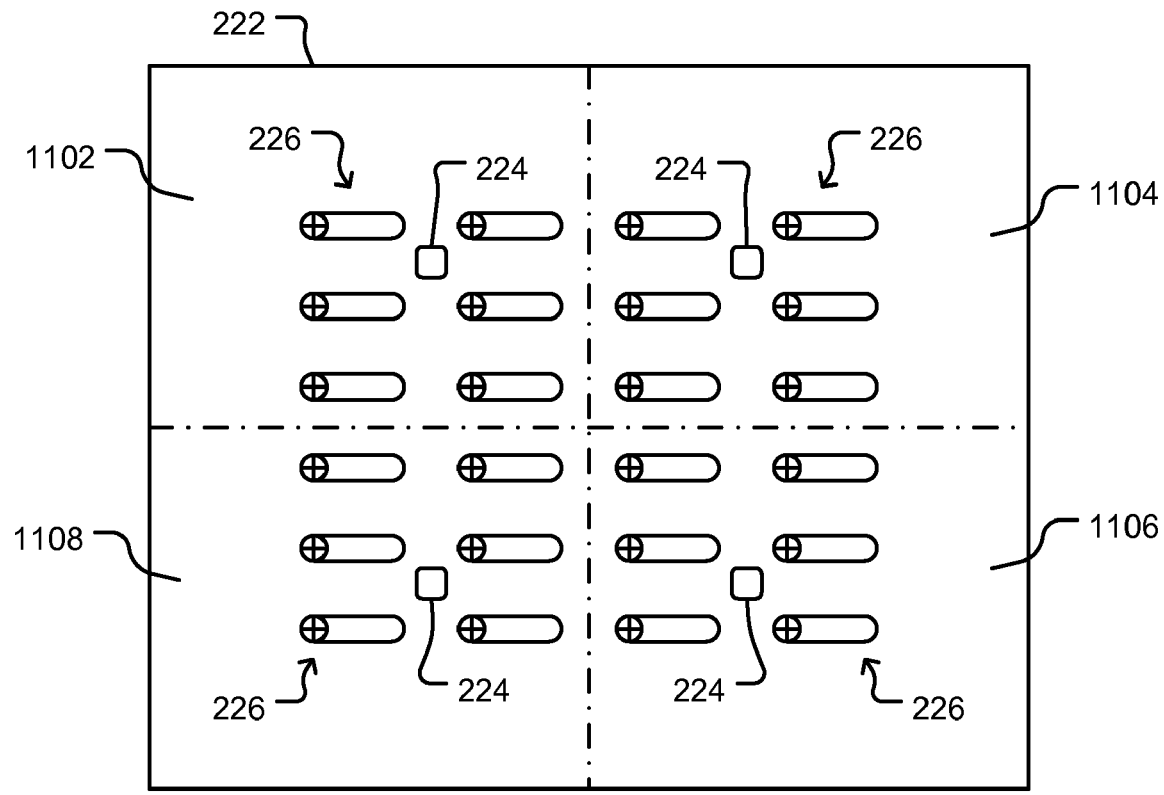
FIGS. 15A and 15B illustrate exemplary configuration of the probe head assembly according to some embodiments of the invention.
Figure 15B:
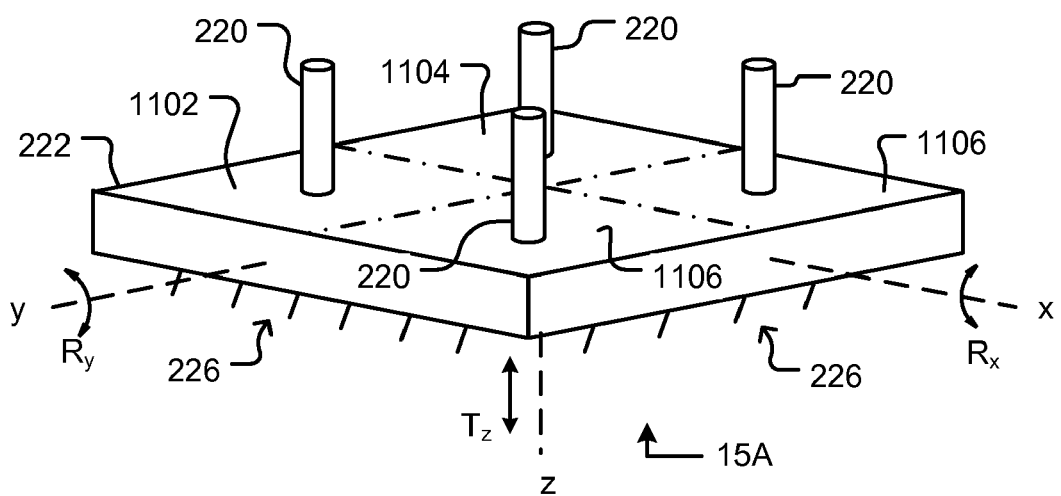

In the examples shown in FIGS. 9-12B, 802, 804, 806 of process 800 of FIG. 8 can be performed with regard to the probe head assembly 222 as a whole. Alternatively, 802, 804, 806 of process 800 can be performed individually with respect to a plurality of sectors of the probe head assembly 222. For example, as discussed below with respect to FIGS. 15A and 15B, the probe head assembly 222 can be divided into sectors, and a sensor or sensors 224 and an actuator or actuators 215 can be provided for each sector. As will be seen, FIG. 15 illustrates a non-limiting example in which the surface of the probe head assembly 222 to which the probes 226 are attached can be divided into sectors 1102, 1104, 1106, 1108 (four are shown in FIGS. 15A and 15B, but the surface can be divided into more or fewer sectors); a sensor 224 can be provided for each sector 1102, 1104, 1106, 1108; and a drive mechanism 220 can also be provided for each sector 1102, 1104, 1106, 1108. In such a case, 802, 804, 806 of the process 800 of FIG. 8 can be performed individually and simultaneously for each sector 1102, 1104, 1106, 1108.

FIGS. 13A-14B and 16A-18B illustrate several non-limiting additional examples or operation of 802, 804, 806 of the process 800 of FIG. 8. For ease of illustration, in FIGS. 13A-14B and 16A-17B, the probe card assembly 234 is shown in partial view. More specifically, the mounting structure 236 is shown in partial view, and the flexible electrical connector 218 and wiring substrate 208 are not shown. The controller 216 and signals 238 and 240 are also not shown.

Figure 13A:
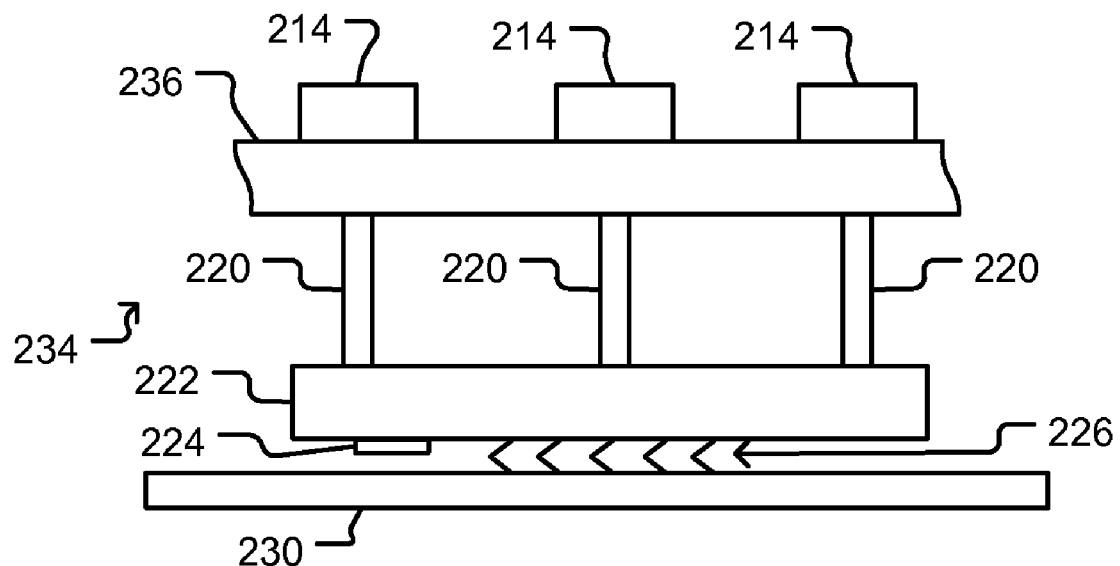
FIGS. 13A-14B illustrate additional exemplary implementations of the process of FIG. 8 according to some embodiments of the invention.
Figure 13B:
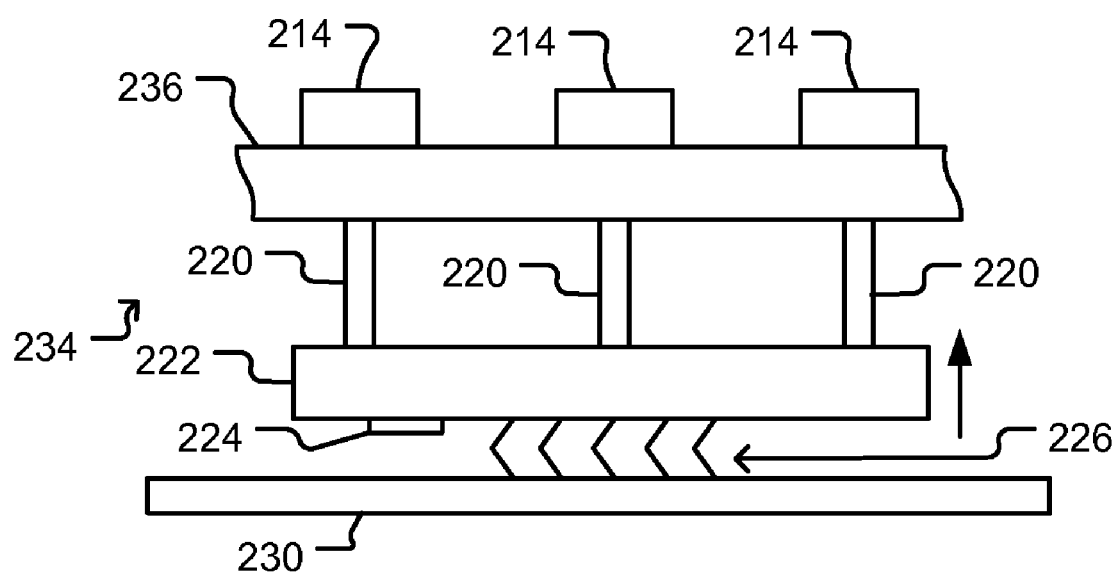

FIGS. 13A and 13B illustrate an exemplary way, according to some embodiments of the invention, in which controller 216 can monitor a compliance demand at 802, determine whether to apportion some of the compliance demand to the actuators 215 at 804, and drive the actuators 215 to apportion the compliance demand at 806, as discussed above with respect to process 800 of FIG. 8. In FIGS. 13A and 13B, the sensor 240 (although one sensor 240 is shown, more can be used) can comprise a strain gauge configured to detect an amount of force on one or more of the probes 226. The controller 216 can execute 802 of FIG. 8 by receiving signals 240 (see FIG. 2) output by the sensor 224, which can be proportional or functionally related (e.g., the output may not be linearly proportional to the force level) to the level of a force on a probe 226. The controller 216 can execute 804 in any of the ways discussed above with respect to 804. For example, the controller 216 can be configured to determine whether the total compliance demand determined at 802 exceeds a predetermined threshold. In one example, the controller 216 can execute 804 of FIG. 8 by comparing the level of the force indicated by signals 240 to a threshold force stored in memory 706 (see FIG. 7). The threshold force can be pre-selected as the maximum force that can safely be applied to the probes 226, that is, the maximum force that can be applied to the probes 226 without significant risk of damaging the probes 226. Such maximum force can be determined by testing the probes in a laboratory environment, through calculations based on known design parameters of the probes, or in other ways. As another example of a manner in which the controller 216 can determine whether to apportion the total compliance demand at 804, the controller 216 can be configured to apportion at 804 a fixed percentage of the total compliance demand determined at 802 to the probes 226. As another exemplary alternative, the controller 216 can be configured to apportion a fixed percentage of the total compliance demand to moving the probe head 222. Put another way, the controller 216 can be configured to apportion at 804 a predetermined level of compliance to either the probes 226 or moving the probe head assembly 222 and to apportion at 804 the balance of the total compliance demand to the other of the probes 226 or the probe head assembly 222.

In the example shown in FIGS. 13A and 13B, the controller 216 can at 806 output control signals 238 that cause the actuators 215 to move the probe head assembly 222 away from DUT 230 (as shown in FIG. 13B) sufficiently to apportion a portion of the total compliance demand determined at 802 to the moving the probe head assembly 222. For example, if the controller determined at 804 whether to apportion the total compliance demand by determining whether the total compliance demand exceeds a threshold, the controller 216 can at 806 output control signals 238 that cause the actuators 215 to reduce the force on the probe 226 to the threshold force. The controller 216 can do so by causing the engines 214 to move the probe head assembly 222 until the controller 216 determines that the force on the probe 226 is at or is less than the threshold force level. Alternatively, the controller 226 can calculate a distance by which the probe head assembly 222 can be moved to reduce the force on the probe 226 to the threshold and cause the engines 214 to move the probe head assembly 222 that distance. Such a calculation can be made using parameters of the probes 226, such as the spring constant of the probes. If the determination at 804 is made based on a criteria other than whether the total compliance demand exceeds a threshold (e.g., any of the alternative techniques discussed above), the controller 216 can at 806 output control signals 238 that cause the actuators 215 to move the probe head assembly 222 away from DUT 230 (as shown in FIG. 13B) until a parameter or parameters relating to the criteria are met.

The sensor 224 in FIGS. 13A and 13B can be other than a strain gauge configured to detect a level of force on a probe 226. For example, the sensor 224 can be configured to detect a distance between the probe head assembly 222 and DUT 230, which can be used to determine or to approximate forces on the probes 226. Examples of suitable sensors 224 for detecting a distance between the probe head assembly 222 and DUT include without limitation capacitive sensors, air gage (gap) sensors, linear variable displacement transducers, and inductive sensors.

Figure 14A:
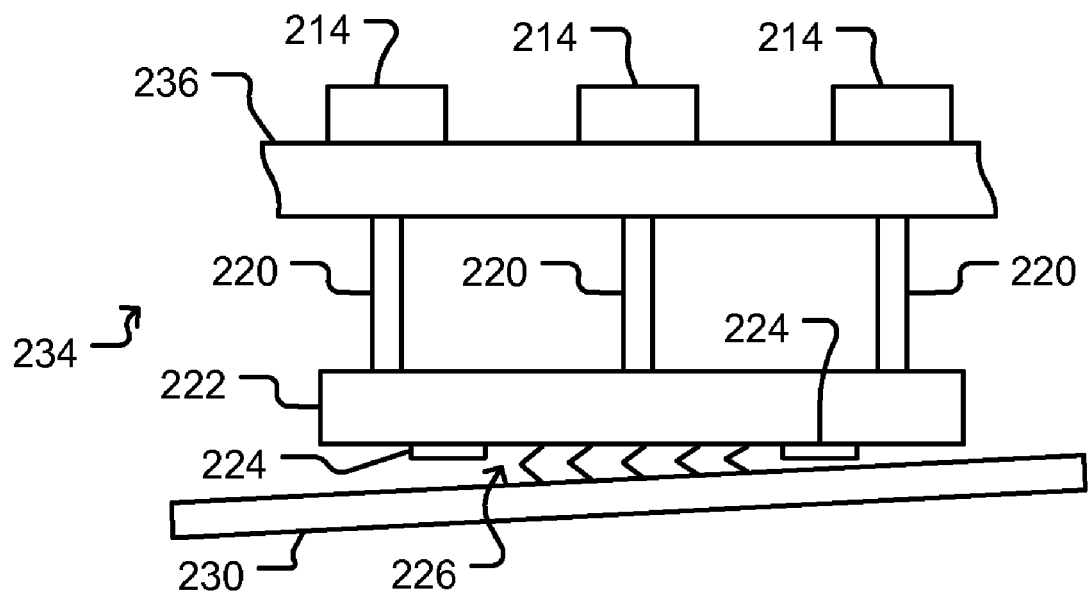
Figure 14B:
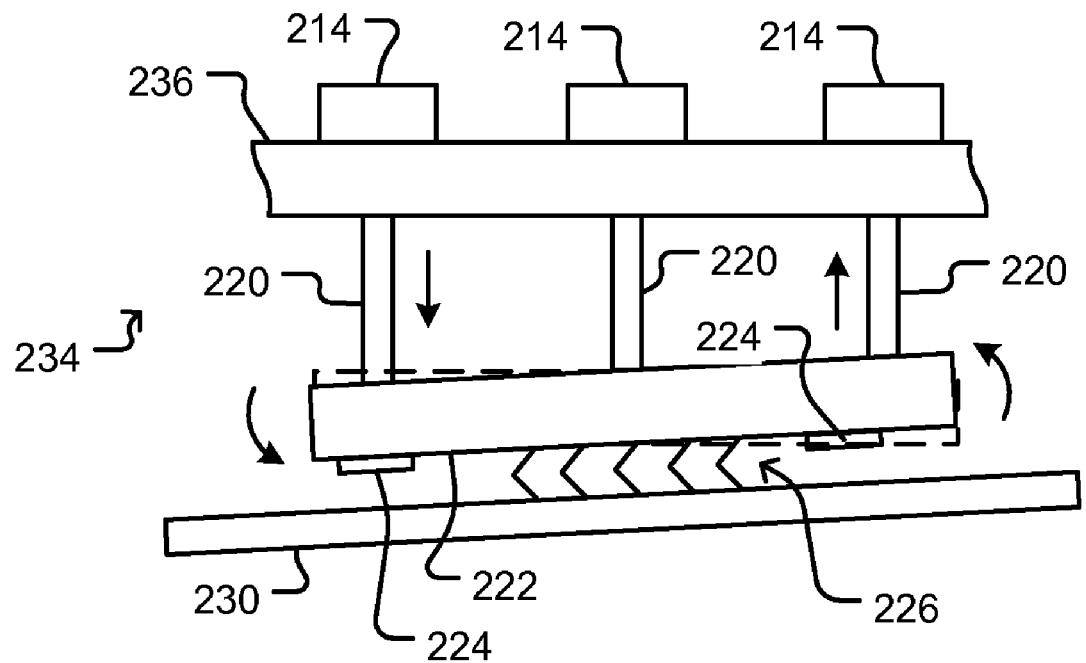

FIGS. 14A and 14B illustrate another exemplary way, according to some embodiments of the invention, in which controller 216 can monitor a compliance demand at 802, determine whether to apportion some of the compliance demand to the actuators 215 at 804, and drive the actuators 215 to apportion the compliance demand at 806 as discussed above with respect to process 800 of FIG. 8. In FIGS. 14A and 14B, the sensor 224 can comprise a plurality of sensors disposed in various locations on the probe head assembly 222 and configured to detect an amount of force on or displacement of one or more of the probes 226 in the various locations on the probe head assembly. Examples of suitable sensors include any of the examples for sensor 224 discussed above with respect to FIGS. 13A and 13B. Alternatively or in addition, one or more of the probes 226 can be configured as a sensor.

The controller 216 can execute 802 of FIG. 8 by receiving signals 240 (see FIG. 2) output by the sensors 224, which are proportional to the level of forces on or displacement of probes 226 at various locations on the probe head assembly 222. The controller 216 can execute 804 of FIG. 8 by determining when an imbalance in the forces or displacement at various locations on the probe head assembly 222 exceeds a threshold imbalance. In the example shown in FIGS. 14A and 11B, the controller 216 can at 806 output control signals 238 that cause the engines 214 to change an orientation (e.g., tilt) of the probe head assembly 222 with respect to the mounting structure 236 to bring the forces or displacement into balance (as shown in FIG. 14B).

The examples shown in FIGS. 13A, 13B and FIGS. 14A, 14B can be combined. In such a combination, the controller 216 can monitor at 802 forces on the probes 226 at various locations on the probe head assembly 222 as discussed above with respect to FIGS. 14A and 14B. At 804, the controller 216 can determine whether any of the forces exceeds a threshold as discussed above with respect to FIGS. 13A and 13B, and the controller 216 can also determine whether an imbalance in the forces on probes 226 at various locations on the probe head assembly 222 exceeds a threshold imbalance as discussed above with respect to FIGS. 14A and 14B. At 806, the controller 806 can output control signals 238 to engines 214 to move the actuators 215 as needed to reduce the forces to the threshold (or to less than the threshold) as discussed above with respect to FIGS. 13A and 10B and to balance the forces as discussed above with respect to FIGS. 14A and 14B.

In the examples shown in FIGS. 16A-18B, the probe head assembly 222 can be divided into sectors, and a sensor 224 and a drive mechanism 220 can be provided for each sector. A non-limiting example is shown in FIGS. 15A (which shows a bottom view of the probe head assembly 222) and FIG. 15B (which shows a perspective view of the probe head assembly 222). As shown in FIG. 15A, the surface of the probe head assembly 222 to which the probes 226 are attached can be divided into sectors 1102, 1104, 1106, 1108 (four are shown in FIGS. 15A and 15B, but the surface can be divided into more or fewer sectors). As shown in FIG. 15A, a sensor 224 can be provided for each sector 1102, 1104, 1106, 1108. As shown in FIG. 15B, a drive mechanism or drive mechanisms 220 can also be provided for each sector 1102, 1104, 1106, 1108. By selective movement of the actuators 215, the probe head assembly 222 can be rotated about the "x" and "y" axes and translated along the "z" axis with respect to the mounting structure 236 (see FIG. 2) a shown in FIG. 15B. In addition, the probe head assembly 222 can be distorted (e.g., the shape of a surface of the probe head assembly 222 to which probes 226 are attached can be altered) by selective movement of the actuators 215. In the examples shown in FIG. 16A-17B, the probe head assembly 222 can be configured as shown in FIGS. 15A and 15B. That is, the probe head assembly 222 can be divided into sectors (e.g., like 1102, 1104, 1006, 1008), and a sensor 224 and a drive mechanism 220 can be provided for each sector.

As mentioned above, FIGS. 16A-16C illustrate yet another exemplary way, according to some embodiments of the invention, in which controller 216 can monitor a compliance demand at 802, determine whether to apportion some of the compliance demand to the actuators 215 at 804, and drive the actuators 215 to apportion the compliance demand at 806. As discussed above with respect to process 800 of FIG. 8. Sensors 224 can be disposed in each sector (e.g., like 1102, 1104, 1106, 1108) of the probe head assembly 222 and can output signals 240 proportional to a distance between the particular sector of the probe head assembly 222 and DUT 230. As DUT 230 is moved toward the probes 226 (e.g., DUT 230 can be placed on holder 232 in FIG. 2, and holder 232 can move DUT 230 toward the probes 226), the controller 216 can determine, from the signals 240 produced by the sensors 224, a degree by which DUT 230 is out of orientation (e.g., tilt) with respect to the probe head assembly 222 (which can be an example of 802 in FIG. 8). (See FIG. 16A.) If the degree of mis-orientation exceeds a desired maximum mis-orientation (which can be an example of 804 in FIG. 8), the controller 216 can generate output signals 238 to the engines 214 that cause one or more of the actuators 215 to move its associated sector of the probe head assembly 222 to change an orientation of the probe head assembly 222 to be more like the orientation of DUT 230 as shown in FIGS. 16B and 16C (which can be an example of 806 of FIG. 8). As shown in FIG. 16C, the probe head assembly 222 can be closely oriented with DUT 230 as DUT 230 contacts the probes 226. Orienting the probe head assembly 222 to DUT 230 can reduce the compliance demand that would otherwise have been required of the probe card assembly 234 (and more specifically the probes 226) by reducing the compliance need to compensate for a mis-orientation of DUT 230 with respect to the probe head assembly 222. That is, by reducing or eliminating the mis-orientation between the probe head assembly 222 and the DUT 230, the amount of compliance needed to compensation for the mis-orientation is reduced or eliminated.

Figure 16A:
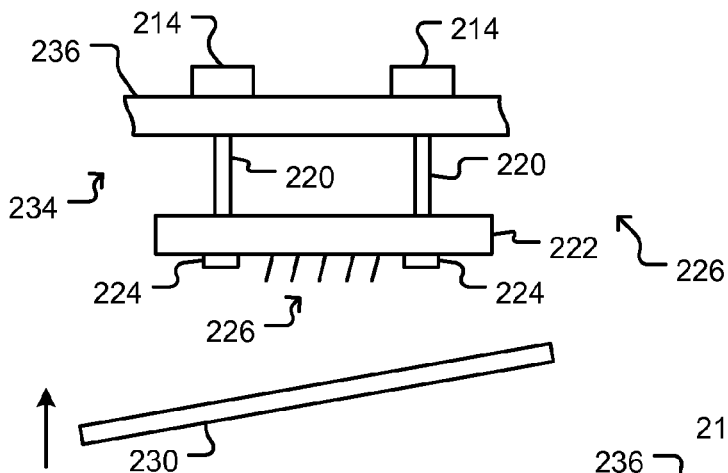
FIGS. 16A-18C illustrate further exemplary implementations of the process of FIG. 8 according to some embodiments of the invention.
Figure 16B:
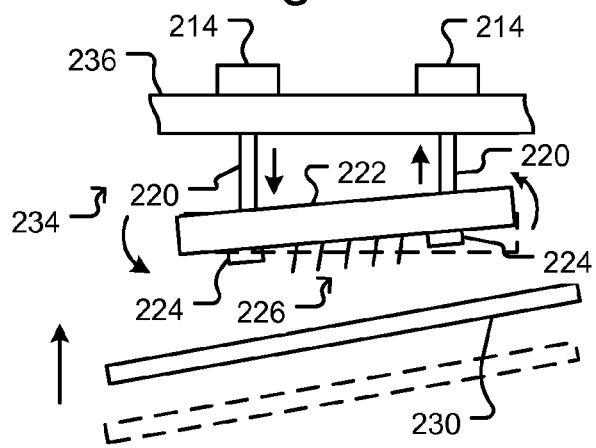
Figure 16C:
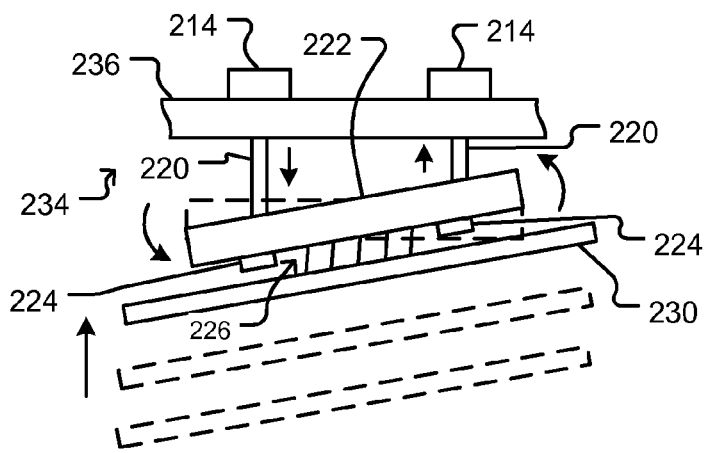
Figure 17A:
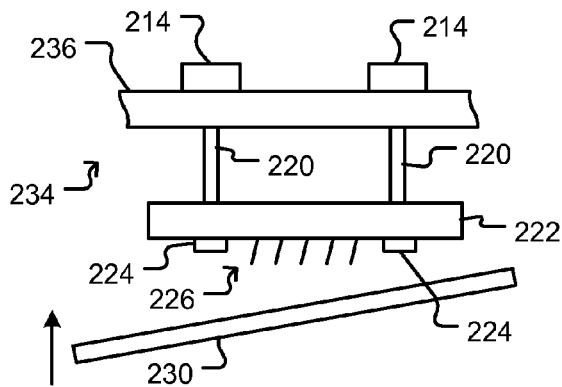
Figure 17B:
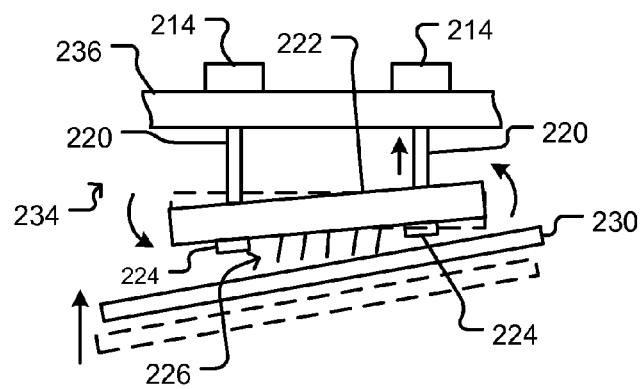
Figure 17C:
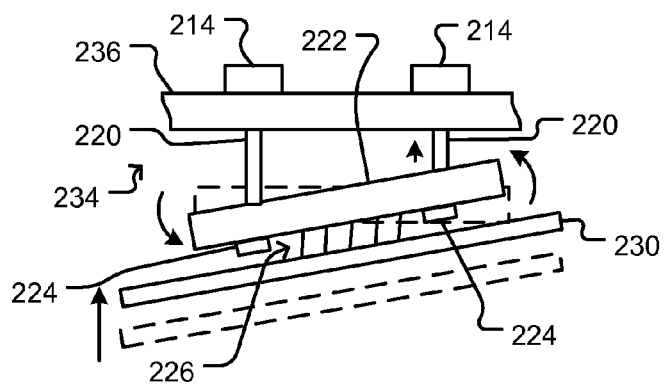

The example shown in FIGS. 17A-17C can be generally similar to the example shown in FIGS. 16A-16C except that the sensors 224 detect contact between a probe 226 in a sector of the probe head assembly and DUT 230. In operation, the controller 216 can be configured to cause a drive mechanism 220 associated with a particular sector (e.g., like sectors 1102, 1104, 1106, 1108) of the probe head assembly 222 to pull that sector away from DUT 230 as the sensor 224 associated with the sector outputs a signal 240 indicating initial contact between a probe 226 in the sector and DUT 230. The controller 216 can be configured to continue doing so until probes 226 in all of the sectors have contacted DUT 230. The result can generally be the same as in the example in FIGS. 16A-16C: the controller 216 outputs control signals 238 that cause the actuators 215 to orient the probe head assembly 222 to an orientation of DUT 230 as DUT 230 is moved into contact with the probes 226.

Figure 18A:
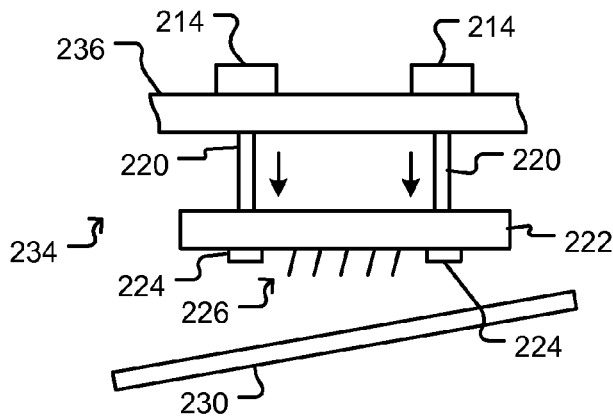
Figure 18B:
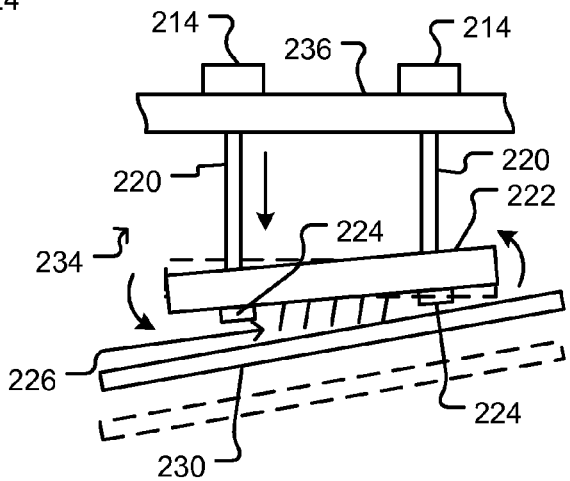
Figure 18C:
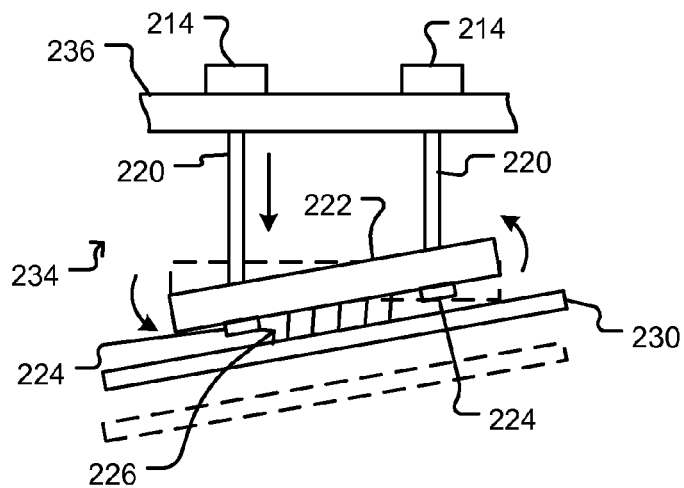

The example shown in FIGS. 18A-18C can be generally similar to the example shown in FIGS. 17A-17C except that probe head assembly 222—as opposed to DUT 230—is moved to effect contact between the probes 226 and DUT 230. In operation, the controller 216 can be configured to cause all of the actuators 215 to move the probe head assembly 222 toward DUT 230 as shown in FIG. 18A. When a sensor 224 in a particular sector (e.g., like sectors 1102, 1104, 1106, 1108) outputs a signal 240 indicating that a probe 226 in its sector has contacted DUT 230, the controller 216 can cause the drive mechanism 220 associated with that sector to stop. Other actuators 215, however, continue to move the probe head assembly 222 toward DUT 230 until the sensors 224 in their sectors output signals 240 indicating that a probe 226 in their sector has contacted DUT 230. The result can generally be the same as in the examples in FIGS. 16A-16C and FIGS. 17A-17C: the probe head assembly 222 self orients with an orientation of DUT 230 as the probes 226 and DUT 230 are brought into contact.

Any of the examples shown in FIGS. 16A-16C, FIGS. 17A-17C, and FIGS. 18A-18C can be configured with sensors 224 that output signals 240 proportional to a force on a probe in the sector (e.g., like 1102, 1104, 1106, 1108) associated with the sensor 224. The controller 216 can determine when a force in a sector exceeds a threshold and can output control signals 238 to the drive mechanism 220 associated with the sector that moves the sector and reduces the force to the threshold.

Although specific embodiments and applications of the invention have been described in this specification, there is no intention that the invention be limited these exemplary embodiments and applications or to the manner in which the exemplary embodiments and applications operate or are described herein.

I claim:

1. A probe card assembly comprising:
a first source of compliance;
a second source of compliance; and
a controller configured to apportion a total compliance demand placed on the probe card assembly between the first source of compliance and the second source of compliance.

2. The probe card assembly of claim 1, wherein:
the first source of compliance comprises a plurality of probes disposed on a probe head assembly and configured to contact an electronic device to be tested; and
the second source of compliance comprises an actuator configured to change, in response to a control signal from the controller, a position of the probe head assembly.

3. The probe card assembly of claim 2, wherein the controller is configured to control the actuator in response to a signal corresponding to the total compliance demand.

4. The probe card assembly of claim 3 further comprising a sensor configured to sense a parameter relating to the total compliance demand and generate the signal corresponding to a compliance demand of the probe card assembly.

5. The probe card assembly of claim 4, wherein:
the signal generated by the sensor corresponds to a level of force on at least one of the probes, and
the controller is configured to control the actuator to reduce the level of the force.

6. The probe card assembly of claim 5, wherein the controller is configured to control the actuator to reduce the level of the force if the level of the force exceeds a predetermined threshold.

7. The probe card assembly of claim 5 further comprising a plurality of actuators, wherein:
the sensor is further configured to sense a plurality of forces on ones of the probes in a plurality of sectors of the probe head assembly and generate a plurality of signals corresponding to the forces; and
the controller is further configured to control individually each actuator to reduce individually a level of one of the forces associated with a particular sector.

8. The probe card assembly of claim 4, wherein the signal provided by the sensor relates to an orientation of the probes with respect to the electronic device to be tested.

9. The probe card assembly of claim 4, wherein the sensor comprises a plurality of sensors each configured to provide a signal relating to a distance between a portion of the probe head assembly and a corresponding portion of the electronic device to be tested.

10. The probe card assembly of claim 9 further comprising a plurality of actuators, wherein each of the actuators is configured to selectively move a portion of the probe card assembly.

11. The probe card assembly of claim 4, wherein the sensor comprises a plurality of sensors each configured to provide a signal indicating contact between one of the probes and the electronic device to be tested.

12. The probe card assembly of claim 4, wherein the actuator is machine driven and the controller receives as input the signal from the sensor and outputs a control signal for driving the actuator.

13. The probe card assembly of claim 2, wherein the electronic device to be tested comprises a plurality of semiconductor dies.

14. The probe card assembly of claim 1, wherein the second source of compliance comprises an actuator coupled to the controller, and wherein the controller is further configured to control the actuator to create a virtual spring.

15. The probe card assembly of claim 1, further comprising a plurality of second sources of compliance, wherein the controller is further configured to apportion the total compliance demand among the plurality of second sources of compliance.

16. The probe card assembly of claim 1, wherein the controller is further configured to limit the compliance demand apportioned to the first source of compliance to less than threshold.

17. The probe card assembly of claim 1, wherein the controller is further configured to set the compliance demand apportioned to the first source of compliance to a percentage of the total compliance demand.

18. The probe card assembly of claim 1, wherein the controller is further configured to set the compliance demand apportioned to the first source of compliance to a predetermined level of compliance.

19. The probe card assembly of claim 1, wherein the second source of compliance is adjustable during testing of a device under test while the first source of compliance is in contact with the device under test.

20. The probe card assembly of claim 1, further comprising a substrate to which the first source of compliance and the second source of compliance are coupled.

21. The probe card assembly of claim 1, wherein the controller is further configured to apportion the compliance demand according to a compound function.

22. A probe card assembly comprising:
means for providing a first source of compliance;
means for providing a second source of compliance; and
means for apportioning a total compliance demand placed on the probe card assembly between the first source of compliance and the second source of compliance.

23. The probe card assembly of claim 22 wherein the means for apportioning a total compliance demand and the means for proving a second source of compliance cooperate to form a virtual spring.

24. The probe card assembly of claim 22, further comprising means for determining the total compliance demand coupled to the means for apportioning.

25. The probe card assembly of claim 22, wherein the means for apportioning is operable while testing a device under test using the probe card assembly.

26. The probe card assembly of claim 22, wherein the means for apportioning apportions the compliance demand according to a compound function.

27. The probe card assembly of claim 22, wherein the means for apportioning comprises means for compensating for warpage of a component of the probe card assembly.

28. The probe card assembly of claim 22, wherein the means for apportioning comprises means for compensating for over travel.

29. The probe card assembly of claim 22, wherein the means for apportioning comprises means for compensating for thermally induced movement.

30. The probe card assembly of claim 22, wherein the means for apportioning comprises means for apportioning a level of compliance to the means for providing a first source of compliance, the level of compliance being selected from the group consisting of: a predetermined level of compliance, a percentage of the total compliance demand, and a portion of the total compliance demand less than a threshold.

* * * * *